(12) United States Patent
Manning

(10) Patent No.: US 8,786,001 B2
(45) Date of Patent: Jul. 22, 2014

(54) SEMICONDUCTOR DEVICES

(75) Inventor: Homer M. Manning, Eagle, ID (US)

(73) Assignee: Round Rock Research, LLC, Jersey City, NJ (US)

( * ) Notice: Subject to any disclaimer, the term of this patent is extended or adjusted under 35 U.S.C. 154(b) by 970 days.

(21) Appl. No.: 12/689,955

(22) Filed: Jan. 19, 2010

(65) Prior Publication Data

US 2010/0117196 A1 May 13, 2010

Related U.S. Application Data

(60) Continuation of application No. 11/077,388, filed on Mar. 10, 2005, now Pat. No. 7,655,968, which is a division of application No. 10/656,732, filed on Sep. 4, 2003, now Pat. No. 7,067,385.

(51) Int. Cl.
*H01L 27/108* (2006.01)
(52) U.S. Cl.
USPC ............. 257/308; 257/E21.018; 257/E21.019
(58) Field of Classification Search
USPC .......... 257/307, 308, E21.651, E21.655, 306, 257/E21.018, E21.019, 303
See application file for complete search history.

(56) References Cited

U.S. PATENT DOCUMENTS

| | | |
|---|---|---|
| 4,517,729 A | 5/1985 | Batra |
| 5,236,860 A | 8/1993 | Fazan et al. |
| 5,340,763 A | 8/1994 | Dennison |
| 5,401,681 A | 3/1995 | Dennison |
| 5,467,305 A | 11/1995 | Bertin et al. |
| 5,498,562 A | 3/1996 | Dennison et al. |
| 5,532,089 A | 7/1996 | Adair et al. |
| 5,604,696 A | 2/1997 | Takaishi |
| 5,605,857 A | 2/1997 | Jost et al. |
| 5,652,164 A | 7/1997 | Dennison et al. |
| 5,654,222 A | 8/1997 | Sandhu et al. |
| 5,686,747 A | 11/1997 | Jost et al. |
| 5,702,990 A | 12/1997 | Jost et al. |
| 5,705,838 A | 1/1998 | Jost et al. |
| 5,767,561 A | 6/1998 | Frei et al. |
| 5,821,140 A | 10/1998 | Jost et al. |
| 5,869,382 A | 2/1999 | Kubota |

(Continued)

FOREIGN PATENT DOCUMENTS

| | | |
|---|---|---|
| DE | 4447804 | 1/2002 |
| JP | 08-274278 | 10/1996 |

(Continued)

OTHER PUBLICATIONS

PCT/US2004/0027898; Filed Aug. 26, 2004; Search Report mailed Jul. 24, 2008.

(Continued)

*Primary Examiner* — Amar Movva
(74) *Attorney, Agent, or Firm* — Lerner, David, Littenberg, Krumholz & Mentlik, LLP

(57) ABSTRACT

A method for forming double-sided capacitors for a semiconductor device includes forming a dielectric structure which supports capacitor bottom plates during wafer processing. The structure is particularly useful for supporting the bottom plates during removal of a base dielectric layer to expose the outside of the bottom plates to form a double-sided capacitor. The support structure further supports the bottom plates during formation of a cell dielectric layer, a capacitor top plate, and final supporting dielectric. An inventive structure is also described.

9 Claims, 25 Drawing Sheets

(56) References Cited

U.S. PATENT DOCUMENTS

| | | | |
|---|---|---|---|
| 5,900,660 A | 5/1999 | Jost et al. |
| 5,955,758 A | 9/1999 | Sandhu et al. |
| 5,981,350 A | 11/1999 | Geusic et al. |
| 5,981,992 A | 11/1999 | Kenney |
| 5,990,021 A | 11/1999 | Prall et al. |
| 6,037,212 A | 3/2000 | Chao |
| 6,037,218 A | 3/2000 | Dennison et al. |
| 6,059,553 A | 5/2000 | Jin et al. |
| 6,090,700 A | 7/2000 | Tseng |
| 6,108,191 A | 8/2000 | Bruchhaus et al. |
| 6,110,774 A | 8/2000 | Jost et al. |
| 6,133,620 A | 10/2000 | Uochi |
| 6,180,450 B1 | 1/2001 | Dennison |
| 6,204,143 B1 | 3/2001 | Roberts et al. |
| 6,204,178 B1 | 3/2001 | Marsh |
| 6,258,650 B1 | 7/2001 | Sunouchi |
| 6,274,497 B1 | 8/2001 | Lou |
| 6,303,518 B1 | 10/2001 | Tian et al. |
| 6,303,956 B1 | 10/2001 | Sandhu et al. |
| 6,323,528 B1 | 11/2001 | Yamazaki et al. |
| 6,331,461 B1 | 12/2001 | Juengling |
| 6,372,554 B1 | 4/2002 | Kawakita et al. |
| 6,383,861 B1 * | 5/2002 | Gonzalez et al. ............ 438/241 |
| 6,399,490 B1 | 6/2002 | Jammy et al. |
| 6,403,442 B1 | 6/2002 | Reinberg |
| 6,432,472 B1 | 8/2002 | Farrell et al. |
| 6,458,653 B1 | 10/2002 | Jang |
| 6,458,925 B1 | 10/2002 | Fasano |
| 6,459,138 B2 | 10/2002 | Reinberg |
| 6,617,222 B1 | 9/2003 | Coursey |
| 6,645,869 B1 | 11/2003 | Chu et al. |
| 6,656,748 B2 | 12/2003 | Hall et al. |
| 6,667,502 B1 | 12/2003 | Agarwal et al. |
| 6,673,693 B2 | 1/2004 | Kirchoff |
| 6,709,978 B2 | 3/2004 | Geusic et al. |
| 6,720,232 B1 | 4/2004 | Tu et al. |
| 6,767,789 B1 | 7/2004 | Bronner et al. |
| 6,784,112 B2 | 8/2004 | Arita et al. |
| 6,784,479 B2 | 8/2004 | Park |
| 6,812,513 B2 | 11/2004 | Geusic et al. |
| 6,822,261 B2 | 11/2004 | Yamakazi et al. |
| 6,822,280 B2 | 11/2004 | Ito et al. |
| 6,844,230 B2 | 1/2005 | Reinberg |
| 6,849,496 B2 | 2/2005 | Jaiprakash et al. |
| 6,893,914 B2 | 5/2005 | Kim et al. |
| 6,897,109 B2 | 5/2005 | Jin et al. |
| 6,927,122 B2 | 8/2005 | Geusic et al. |
| 6,930,640 B2 | 8/2005 | Chung et al. |
| 6,991,980 B2 | 1/2006 | Park |
| 7,042,040 B2 | 5/2006 | Horiguchi |
| 7,053,435 B2 | 5/2006 | Yeo et al. |
| 7,064,028 B2 | 6/2006 | Ito et al. |
| 7,064,365 B2 | 6/2006 | An et al. |
| 7,073,969 B2 | 7/2006 | Kamm |
| 7,074,669 B2 | 7/2006 | Iijima et al. |
| 7,081,384 B2 | 7/2006 | Birner et al. |
| 7,084,451 B2 | 8/2006 | Forbes et al. |
| 7,125,781 B2 | 10/2006 | Manning et al. |
| 7,160,788 B2 | 1/2007 | Sandhu et al. |
| 7,179,706 B2 | 2/2007 | Patraw et al. |
| 7,199,005 B2 | 4/2007 | Sandhu et al. |
| 7,202,127 B2 | 4/2007 | Busch et al. |
| 7,393,741 B2 | 7/2008 | Sandhu et al. |
| 7,413,952 B2 | 8/2008 | Busch et al. |
| 7,449,391 B2 | 11/2008 | Manning et al. |
| 2001/0012223 A1 | 8/2001 | Kohyama |
| 2001/0026974 A1 | 10/2001 | Reinberg |
| 2001/0044181 A1 | 11/2001 | Nakamura |
| 2002/0022339 A1 | 2/2002 | Kirchhoff |
| 2002/0030221 A1 | 3/2002 | Sandhu et al. |
| 2002/0039826 A1 | 4/2002 | Reinberg |
| 2002/0086479 A1 | 7/2002 | Reinberg |
| 2002/0090779 A1 | 7/2002 | Jang |
| 2002/0098654 A1 | 7/2002 | Durcan et al. |
| 2002/0153589 A1 | 10/2002 | Oh |
| 2002/0153614 A1 | 10/2002 | Ema et al. |
| 2002/0163026 A1 | 11/2002 | Park |
| 2003/0085420 A1 * | 5/2003 | Ito et al. ............ 257/309 |
| 2003/0153146 A1 | 8/2003 | Won et al. |
| 2003/0178684 A1 | 9/2003 | Nakamura |
| 2003/0190782 A1 | 10/2003 | Ko et al. |
| 2003/0227044 A1 * | 12/2003 | Park ............ 257/301 |
| 2004/0018679 A1 | 1/2004 | Yu et al. |
| 2004/0056295 A1 | 3/2004 | Agarwal et al. |
| 2004/0110340 A1 | 6/2004 | Kim et al. |
| 2004/0150070 A1 | 8/2004 | Okada et al. |
| 2004/0188738 A1 | 9/2004 | Farnworth et al. |
| 2005/0051822 A1 | 3/2005 | Manning |
| 2005/0054159 A1 | 3/2005 | Manning et al. |
| 2005/0158949 A1 | 7/2005 | Manning |
| 2005/0176210 A1 | 8/2005 | Kim et al. |
| 2005/0287780 A1 | 12/2005 | Manning et al. |
| 2006/0014344 A1 | 1/2006 | Manning |
| 2006/0024958 A1 | 2/2006 | Ali |
| 2006/0046420 A1 | 3/2006 | Manning |
| 2006/0051918 A1 | 3/2006 | Busch et al. |
| 2006/0063344 A1 | 3/2006 | Manning et al. |
| 2006/0063345 A1 | 3/2006 | Manning et al. |
| 2006/0115951 A1 | 6/2006 | Mosley |
| 2006/0121672 A1 | 6/2006 | Basceri et al. |
| 2006/0148190 A1 | 7/2006 | Busch et al. |
| 2006/0186451 A1 | 8/2006 | Dusberg et al. |
| 2006/0211211 A1 | 9/2006 | Sandhu et al. |
| 2006/0249798 A1 | 11/2006 | Manning |
| 2006/0261440 A1 | 11/2006 | Manning |
| 2006/0263968 A1 | 11/2006 | Manning |
| 2007/0032014 A1 | 2/2007 | Sandhu et al. |
| 2007/0048976 A1 | 3/2007 | Raghu |
| 2007/0093022 A1 | 4/2007 | Basceri |
| 2007/0099328 A1 | 5/2007 | Chiang et al. |
| 2007/0145009 A1 | 6/2007 | Fucskco et al. |
| 2007/0196978 A1 | 8/2007 | Manning |
| 2007/0207622 A1 | 9/2007 | Rana et al. |
| 2007/0238259 A1 | 10/2007 | Bhat |
| 2008/0090416 A1 | 4/2008 | Raghu et al. |
| 2009/0047769 A1 | 2/2009 | Bhat et al. |

FOREIGN PATENT DOCUMENTS

| | | |
|---|---|---|
| JP | 10-189912 | 7/1998 |
| JP | 11-191615 | 7/1999 |
| JP | 2000-196038 | 7/2000 |
| JP | 2003-142605 | 5/2003 |
| JP | 2003-264246 | 9/2003 |
| JP | 2003-273247 | 9/2003 |
| JP | 2003-297952 | 10/2003 |
| JP | 2004072078 | 3/2004 |
| JP | 2003-111626 | 4/2004 |
| JP | 2004-128463 | 4/2004 |
| JP | 2005032982 | 2/2005 |
| KR | 20010061020 | 7/2001 |
| KR | 10-2001-108963 | 12/2001 |
| KR | 20010114003 | 12/2001 |
| KR | 1020030058018 | 7/2003 |
| KR | 1020050000896 | 1/2005 |

OTHER PUBLICATIONS

PCT/US2004/0027898; Filed Aug. 26, 2004; Written Opinion mailed Jul. 24, 2008.
PCT/US2004/0040252; Filed Dec. 1, 2004; Search Report mailed May 25, 2005.
PCT/US2004/0040252; Filed Dec. 1, 2004; Written Opinion mailed May 25, 2005.
PCT/US2005/024936; Filed Jul. 15, 2005; Search Report mailed Jun. 15, 2006.
PCT/US2005/024936; Filed Jul. 15, 2005; Written Opinion mailed Jun. 15, 2006.
PCT/US2006/06806; Filed Feb. 27, 2006; Iper mailed Mar. 30, 2007.
PCT/US2006/06806; Filed Feb. 27, 2006; Search Report mailed Sep. 28, 2006.
PCT/US2006/06806; Filed Feb. 27, 2006; Written Opinion mailed Sep. 28, 2006.

(56) References Cited

OTHER PUBLICATIONS

PCT/US2006/06806; Filed Feb. 27, 2006; Response to Written Opinion filed Sep. 18, 2007.
PCT/US2008/070071; Filed May 31, 2007; Search Report mailed Nov. 29, 2007.
PCT/US2008/070071; Filed May 31, 2007; Written Opinionmailed Nov. 29, 2007.
Banhart, Aluminum Foams: On the Road to Real Applications, MRS Bulletin, pp. 290-295 (Apr. 2003).
Gibson et al., Cellular Solids, MRS Bulletin, pp. 270-274 (Apr. 2003).
Green et al., Cellular Ceramics: Intriguing Structures, Novel Properties, and Innovative Applications, MRSBULLETIN, pp. 296-300 (Apr. 2003).
Green et al., The Structure and Applications of Cellular Ceramics, WEB Extra, 10 pages. (Apr. 2003).
Karp et al., Scaffolds for Tissue Engineering, MRS Bulletin, pp. 301-306 (Apr. 2003).
Kraynik, Foam Structure: From Soap Froth to Solid Foams, MRS Bulletin, pp. 275-276 (Apr. 2003).
Maire et al., In Situ X-Ray Tomography Measurements of Deformation in Cellular Solids, MRS Bulletin, pp. 284-289 (Apr. 2003).
Oh et al., Preparation and Pore-Characteristics Control of Nano-Porous Materials Using Organometallic Building Blocks, 4 Carbon Science, No. 1, pp. 1-9 (Mar. 2003).
Onck, Scale Effects in Cellular Metals, MRS Bulletin, pp. 279-283 (Apr. 2003).
Park et al., Block Copolymer Lithography: Periodic Arrays of 1011 Holes in 1 Square Centimeter, 276 Science, pp. 1401-1404 (May 30, 1997).
Tsukada et al., Preparation and Application of Porous Silk Fibroin Materials, 54 Journal of Applied Polymer Science, pp. 507-514 (1994).
Li, X and Bohn, P.W.; "Metal-assisted chemical etching in HF/H2O2 produces porous silicon" American Institute of Physics, vol. 77, No. 16, Oct. 16, 2000.
"Novel Robust Cell Capacitor (Leaning Exterminated Ring Type Insulator) and New Storage Node Contact for 70nm DRAM Technology and Beyond"; Park et al.; Jul. 2004; pp. 34-35.
J. P. O'Sullivan et al., The morphology and mechanism of formation of porous anodic films on aluminum, Proc. Roy. Soc. Lond. A, vol. 317, pp. 511-543 (1970).
S. Shingubara, Fabrication of nanomaterials using porous alumina templates, J. Nanoparticle Res., vol. 5, pp. 17-30 (2003).
S. Tan et al., High Aspect Ratio Microstructures on Porous Anodic Aluminum Oxide, IEEE, pp. 267-272 (1995).
J. Liang et al., Nonlithographic Fabrication of Lateral Superlattices for Nanometric Electromagnetic-Optic . . . , vol. 8, No. 5, pp. 998-1008; (Sep./Oct. 2002).
H. Masuda et al., Highly ordered nanochannel-array architecture in anodic alumina, App. Phys. Lett, vol. 71,No. 19, pp. 2770-2772 (Nov. 1997).
D. Crouse et al., Self-Assembled Nanostructures Using Anodized Alumina Thin Films for Optoelectronic Applications, IEEE, pp. 234-235 (1999).
A. Nadeem et al., Fabrication of Microstructures Using Aluminum Anodization Techniques, pp. 274-277; (pre-2004).
C. Y. Liu et al., Ordered anodic alumina nanochannels on focused-ion-beam-prepatterned aluminum surfaces, Appl. Phys. Lett., vol. 78, No. 1, pp. 120-122 (Jan. 2001).
Kim,D.H. et al., "A Mechanically Enhanced Storage Node for Virtually Unlimited Height (MESH) Capacitor Aiming at Sub 70nm DRAMs", IEEE, IEDM Jan. 2004, pp. 3.4.1-3.4.4.
Yasaitis et al. "A Modular Process for Integrating Thick Polysilicon Mems Devices with Sub-micron CMOS" www. eecs.berkeley.edu/-boxer/publications/yasaitis03.pdg; pre-2004.
V.V. Konovalov et al., Chemistry of Materials, Chem. Mater., vol. 11, No. 8, pp. 1949-1951 (Aug. 1999).

\* cited by examiner

SEMICONDUCTOR DEVICES

RELATED PATENT DATA

Cross Reference to Related Application

This application is a continuation of and claims priority to U.S. patent application Ser. No. 11/077,388, which was filed on Mar. 10, 2005, and issued as U.S. Pat. No. 7,655,968 on Feb. 2, 2010, which is a divisional of U.S. patent application Ser. No. 10/656,732, which was filed Sept. 4, 2003, and issued as U.S. Pat. No. 7,067,385 on Jun. 27, 2006, both of which are incorporated herein by reference.

FIELD OF THE INVENTION

This invention relates to the field of semiconductor manufacture and, more particularly, to a method for forming a double-sided capacitor having lateral support for its capacitor bottom plate.

BACKGROUND OF THE INVENTION

During the manufacture of semiconductor devices which comprise memory elements, such as dynamic random access memories (DRAMs), static random access memories (SRAMs), and some microprocessors, capacitors such as container capacitors and pedestal capacitors are commonly formed. Container and pedestal capacitors are well known to allow an increased stored charge over planar capacitors by increasing the surface area on which the charge may be stored.

FIGS. 1-7 depict a conventional method for forming a plurality of container capacitors from polysilicon. Formation of a pedestal capacitor is similar, but the bottom plate is a solid plug and the cell dielectric and top plate are conformal with the exterior of the bottom plate to form a single-sided vertically-oriented capacitor. FIG. 1 depicts a semiconductor wafer substrate assembly 10 comprising a semiconductor wafer 12 having a plurality of doped source/drain regions 14 within the wafer 12. FIG. 1 further depicts transistors 16 comprising gate oxide 18, a doped polysilicon control gate 20, silicide 22 such as tungsten silicide which increases conductivity of the control gate 20, and a capping layer 24 often manufactured from silicon nitride. Silicon nitride spacers 26 are formed to insulate the control gate 20 and silicide 22 from polysilicon pads 28 to which the container capacitors will be electrically coupled. Shallow trench isolation (STI, field oxide) 30 reduces unwanted electrical interaction between adjacent control gates. An etch stop layer 31 is formed, then a thick layer of deposited oxide 32 such as borophosphosilicate glass (BPSG) formed to provide a base dielectric layer for capacitor features which are formed later. A patterned photoresist layer 34 defines the location of the container capacitors to be formed. The FIG. 1 structure may further include one or more bit (digit) lines under the BPSG layer or various other structural elements or differences which, for simplicity of explanation, have not been depicted.

The FIG. 1 structure is subjected to an anisotropic etch which removes the exposed portions of the BPSG layer to expose the etch stop layer 31 and to form a patterned BPSG layer which provides a base dielectric having recesses for the capacitors. The exposed portion of the etch stop is the removed. Subsequent to the etch of etch stop 31 the polysilicon pads 28 and possibly a portion of capping layer 24 are exposed to result in a structure similar to FIG. 2. The remaining photoresist layer 34 is stripped and any polymer (not depicted) which forms during the etch is removed according to means known in the art to provide the FIG. 3 structure.

As depicted in FIG. 4, a blanket conductive layer 40 such as polysilicon or another material is formed conformal with the deposited oxide layer, and will provide a capacitor storage node for the completed capacitor. A thick blanket filler material 42, such as photoresist, is formed to fill the containers provided by polysilicon 40. The FIG. 4 structure is then subjected to a planarizing process, such as a chemical planarization, a mechanical planarization, or a chemical mechanical planarization (CMP) step. This process removes portions of the photoresist 42, the polysilicon 40, and usually a portion of the BPSG 32 to result in the FIG. 5 structure.

Next, the BPSG 32 is partially etched with an etch selective to polysilicon (i.e. an etch which minimally etches or, preferably, doesn't etch polysilicon) to result in the structure of FIG. 6. At this point in the process the polysilicon storage nodes (capacitor bottom plates) 40 are only minimally supported. The bottom plates 40 in the FIG. 6 structure each comprise a first region 60 which defines a recess, and a second region 62 which defines an opening to the recess, with the first and second regions being continuous, each with the other. In other words, the bottom plate 40 of FIG. 6 defines a receptacle having a rim 62 which defines an opening to the interior of the receptacle. The regions 60, 62 form vertically-oriented sides of the bottom plate, and the sides are electrically-coupled by a horizontally-oriented bottom 64.

Next, a cell dielectric layer 70, for example a layer of high-quality cell nitride, a polysilicon container capacitor top plate 72, and a planar oxide layer such as BPSG 74 are formed according to means known in the art to result in the FIG. 7 structure. This forms a "double-sided" capacitor, as both the capacitor cell dielectric 70 and capacitor top plate 72 follow the contours of the majority of both the inside and outside of each container capacitor bottom plate 40. After forming the structure of FIG. 7, wafer processing continues according to means known in the art.

It can be seen at the FIG. 6 structure that conventional processes remove the oxide 32 which supports the capacitor bottom plate 40. This oxide removal is performed to allow formation of the cell dielectric and capacitor top plate on both sides of the bottom plate to form a double-sided capacitor. The structure of FIG. 6 is easily damaged and susceptible to defects such as leaning (caused, for example, during the etch of BPSG 32 of FIG. 5 to result in FIG. 6), toppling, or lifting of the bottom plate. However, it is desirable to form a double-sided capacitor to increase the cell capacitance which allows the cell height to be decreased over a single sided capacitor. Limiting this vertical dimension of the cell capacitor is desirable because it sets the depth of the contact level to follow. For example, current etch tool technology can etch contacts to a depth of about 3.0 micrometers ($\mu m$) to about 3.5 $\mu m$. If the capacitor height causes the contact depth to go beyond the 3.0 $\mu m$ to 3.5 $\mu m$ limit, then additional masking layers will be needed. One way to do this is to form a portion of the contact to diffusion areas in the wafer before forming the capacitor, then forming the remaining portion after forming the capacitor. Such a process is complex and adds significantly to device cost.

Another problem which can occur during conventional processing results indirectly from the etch of BPSG layer 32 of FIG. 5 to result in the FIG. 6 structure. During this etch, BPSG over the device periphery (not depicted) is also etched, which forms a step in the oxide between the periphery, where there are no cell capacitors, and the array, where the tops of the cell capacitors are at the original level of the top of BPSG 32. After forming the cell dielectric and top plate, the periphery region must be backfilled with oxide, which is then planarized. The requirement to backfill and planarize results in additional processing steps, which contributes to a further increase in costs.

A method used to form a double-sided capacitor such as a container capacitor or a pedestal capacitor which reduces or eliminates one or more the problems described above, and a structure resulting therefrom, would be desirable.

SUMMARY OF THE INVENTION

An embodiment of the present invention provides a new method which, among other advantages, reduces problems associated with the manufacture of semiconductor devices, particularly problems resulting from instability of unsupported capacitor bottom plates prior to formation of a supporting layer.

Various embodiments of the present invention provide lateral support for a vertically-oriented structure, for example a storage capacitor such as a container capacitor or a pedestal capacitor.

Additional advantages will become apparent to those skilled in the art from the following detailed description read in conjunction with the appended claims and the drawings attached hereto.

It should be emphasized that the drawings herein may not be to exact scale and are schematic representations. The drawings are not intended to portray the specific parameters, materials, particular uses, or the structural details of the invention, which can be determined by one of skill in the art by examination of the information herein.

DETAILED DESCRIPTION OF THE PREFERRED EMBODIMENT

The term "wafer" is to be understood as a semiconductor-based material including silicon, silicon-on-insulator (SOI) or silicon-on-sapphire (SOS) technology, doped and undoped semiconductors, epitaxial layers of silicon supported by a base semiconductor foundation, and other semiconductor structures. Furthermore, when reference is made to a "wafer" in the following description, previous process steps may have been utilized to form regions or junctions in or over the base semiconductor structure or foundation. Additionally, when reference is made to a "substrate assembly" in the following description, the substrate assembly may include a wafer with layers including dielectrics and conductors, and features such as transistors, formed thereover, depending on the particular stage of processing. In addition, the semiconductor need not be silicon-based, but could be based on silicon-germanium, silicon-on-insulator, silicon-on-sapphire, germanium, or gallium arsenide, among others. Further, in the discussion and claims herein, the term "on" used with respect to two layers, one "on" the other, means at least some contact between the layers, while "over" means the layers are in close proximity, but possibly with one or more additional intervening layers such that contact is possible but not required. Neither "on" nor "over" implies any directionality as used herein.

Figure 8:
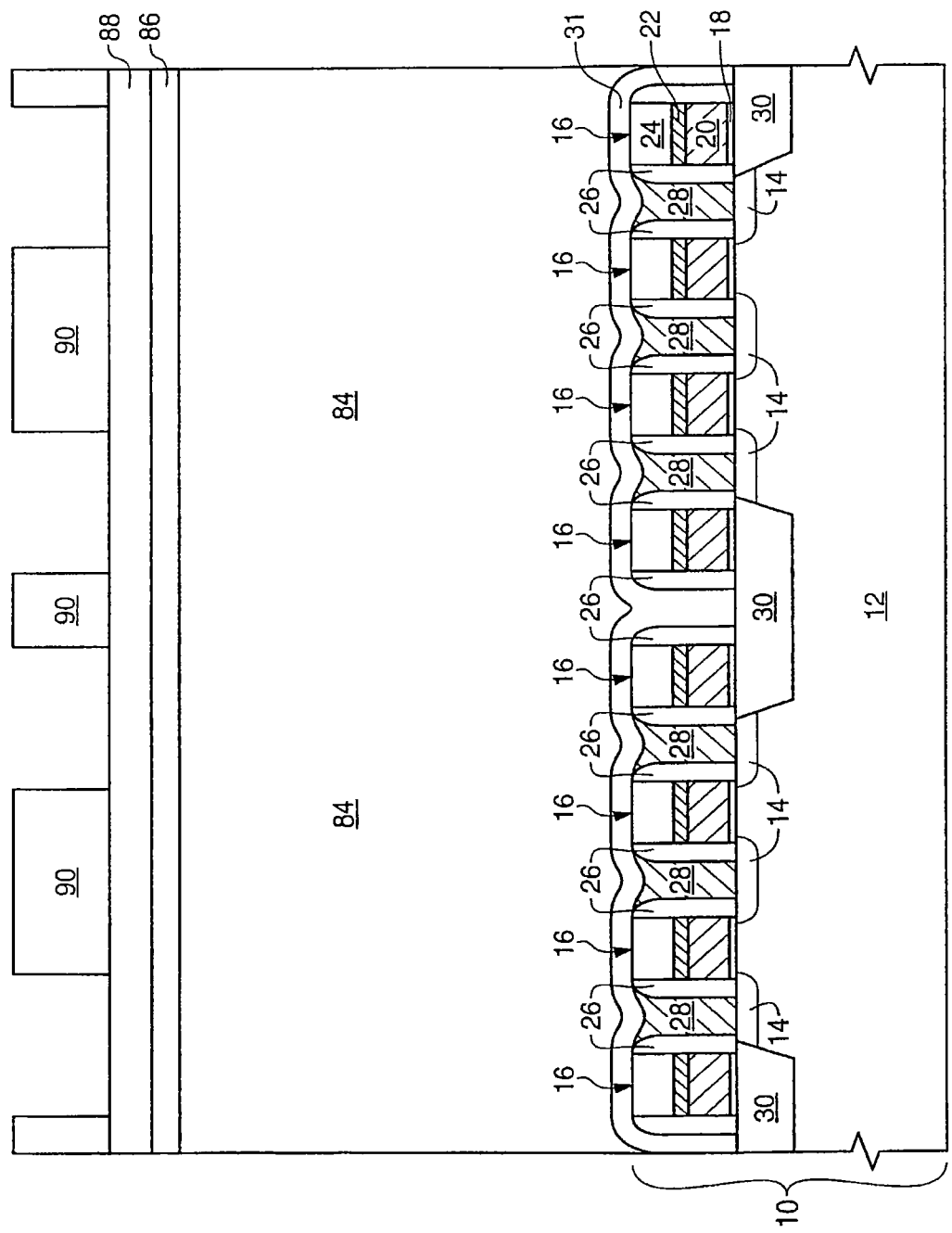
FIGS. 8-16 and 18-20 are cross sections.

A first embodiment of an inventive method used during the formation of a semiconductor device, and various inventive in-process structures, are depicted in FIGS. 8-20. FIG. 8 depicts a structure comprising a semiconductor wafer substrate assembly 10 comprising a semiconductor wafer 12, conductively-doped regions 14 within the wafer, transistors comprising gate oxide 18, a word line 20, silicide 22 which enhances conductivity of the word line, a dielectric transistor capping layer 24, dielectric spacers 26, and conductive contact pads 28. The contact pads 28 reduce the amount of dielectric which must be removed during an etch of an overlying dielectric layer.

After forming the features of the wafer substrate assembly 10, a blanket etch stop layer 31 is formed. The etch stop layer 31 may comprise a layer of silicon nitride, silicon carbon (Si.C), aluminum oxide ($Al_2O_3$), or another material between about 50 angstroms (Å) and about 1,000 Å thick. Next, a base dielectric layer 84, for example borophosphosilicate glass (BPSG), phosphosilicate glass (PSG), spun-on dielectric (SOD), or undoped silicate glass (USG), is formed over etch stop layer 31. A blanket support layer 86 and a blanket sacrificial layer 88 are formed over the base dielectric layer 84. Properties of support layer 86 and sacrificial layer 88 include etchability of layers 88 and 84 selective to layer 86 (i.e. layers 88 and 84 can be etched while removing none or very little of layer 86). Layer 86 may comprise a second silicon nitride layer between about 200 Å and about 1,200 Å thick, and layer 88 can comprise a silicon dioxide layer, for example using a BPSG or tetraethyl orthosilicate (TEOS) process, between about 300 Å and about 600 Å thick, preferably about 400 Å. Next, a patterned etch mask 90 is formed having openings therein which allow an etch to expose contact pads 28.

Figure 9:
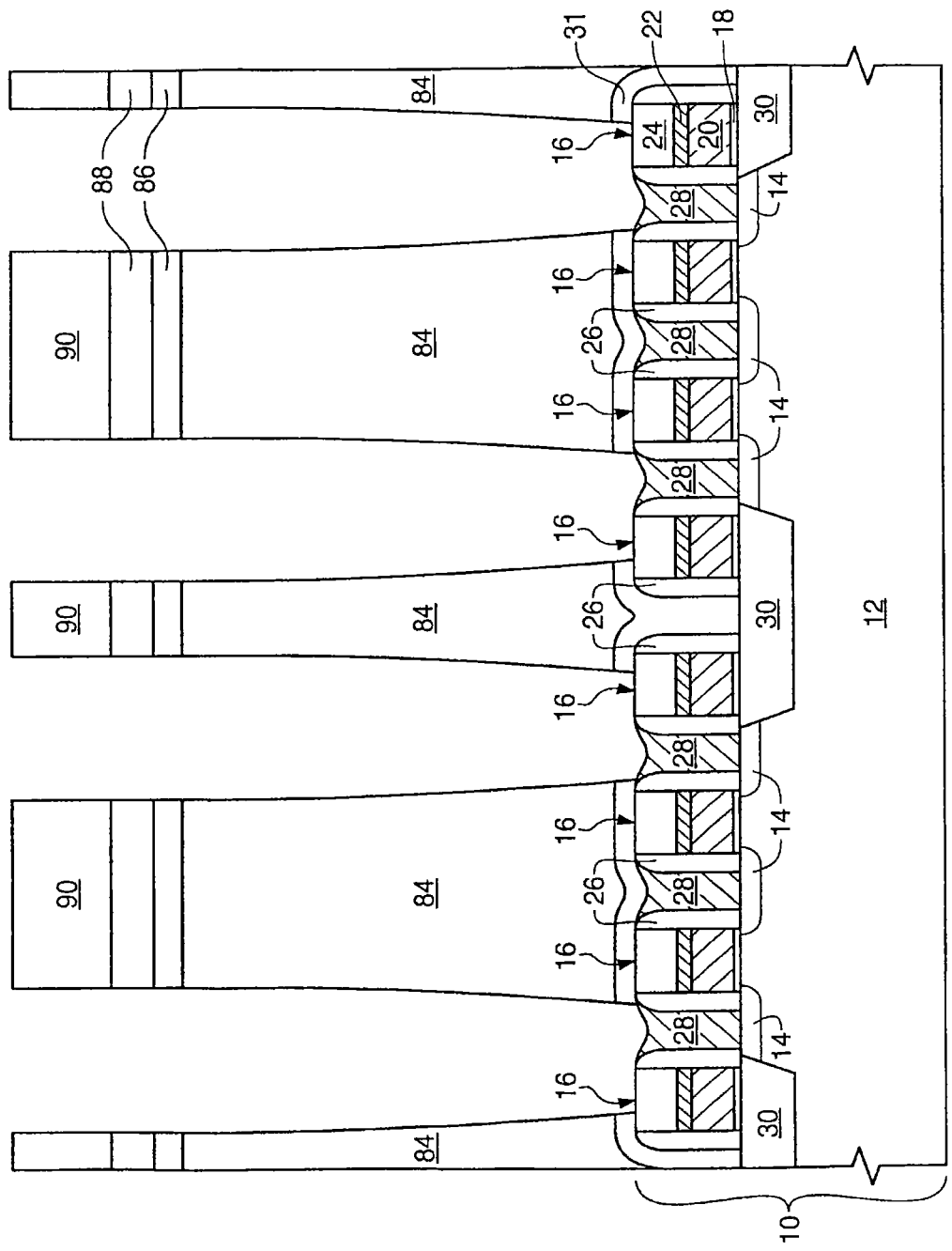

After forming mask layer 90, the structure of FIG. 8 is etched to remove the exposed portions of sacrificial layer 88, support layer 86, base dielectric layer 84, and etch stop layer 31, and to expose contact pads 28 and possibly a portion of capping layer 24 to result in a structure similar to FIG. 9. A single etch can initially be used to remove exposed portions of sacrificial silicon dioxide layer 88, silicon nitride support layer 86, and timed to stop within base dielectric layer 84 prior to exposing etch stop 31. The chemistry can then be changed so that any remaining base dielectric layer 84 is removed while stopping on etch stop 31. Then, optionally, the etch can be changed and performed for a time to sufficiently remove exposed portions of etch stop 31 which exposes contact pad 28, while not excessively etching capping layer 24 or spacers 26. The etch stop layer 31 may also be left in place.

Figure 10:
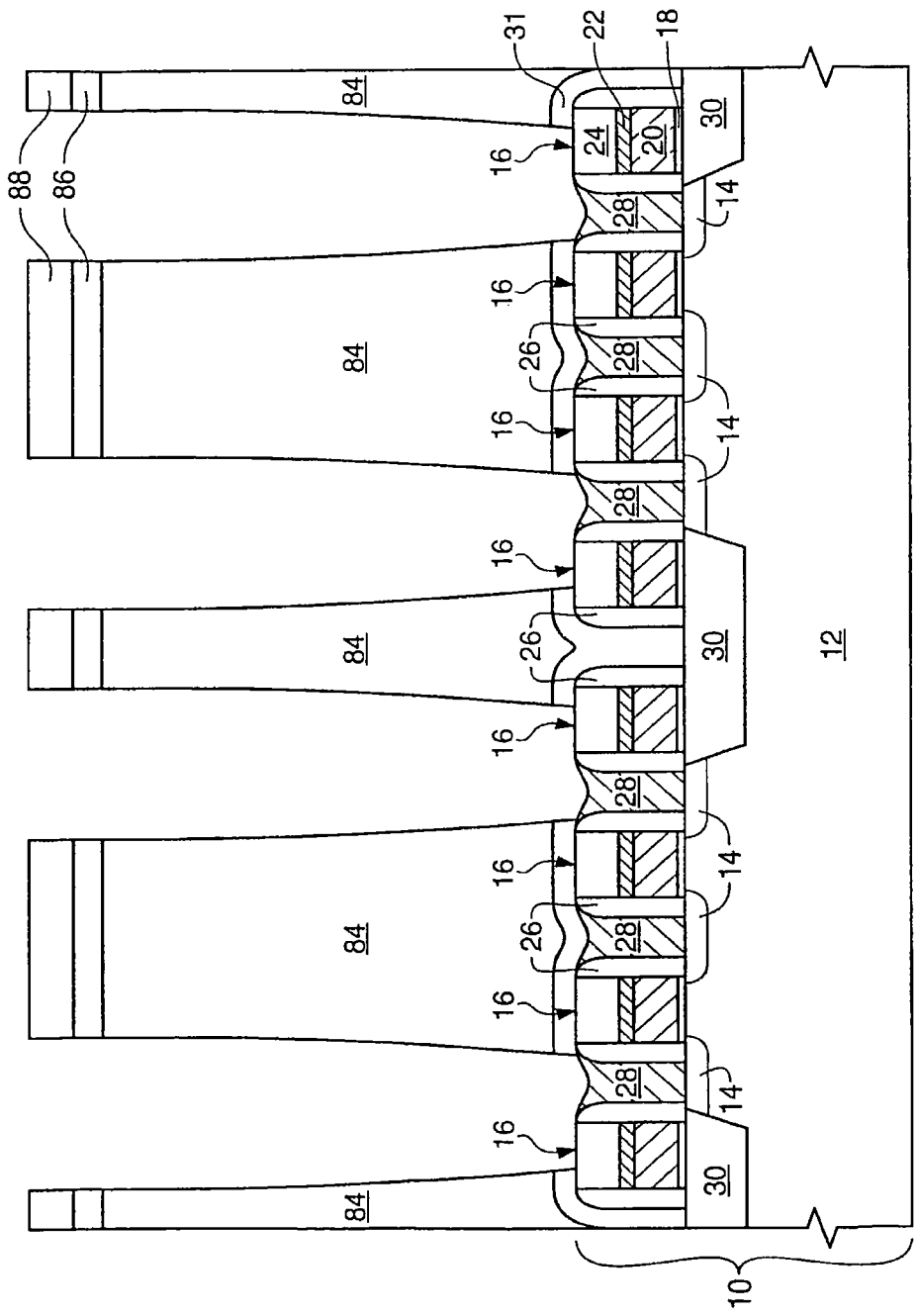

After forming the FIG. 9 structure, photoresist layer 90 is removed, along with any polymer (not depicted) or other contaminants which form during the etch, to result in the structure of FIG. 10.

Figure 11:
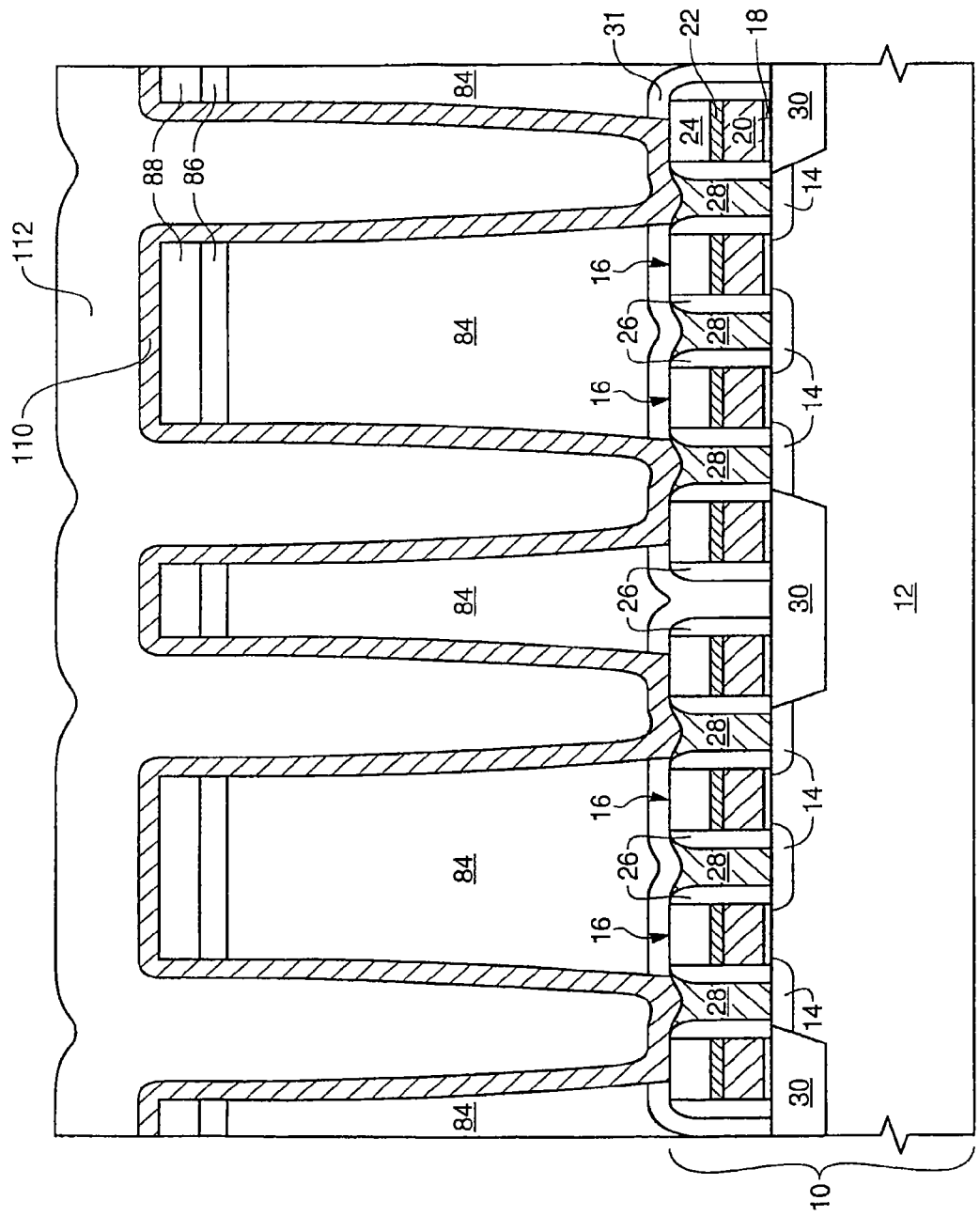

Next, a blanket conformal capacitor bottom plate layer 110 such as titanium nitride is formed as depicted in FIG. 11. A protective layer 112 such as photoresist, is formed within the container to prevent contaminants from being deposited into the interior of the container formed by the bottom plate during subsequent processing. After forming bottom plate layer 110 and protective layer 112, the structure is planarized, for example using chemical mechanical planarization (CMP) to result in the FIG. 12 structure.

Figure 12:
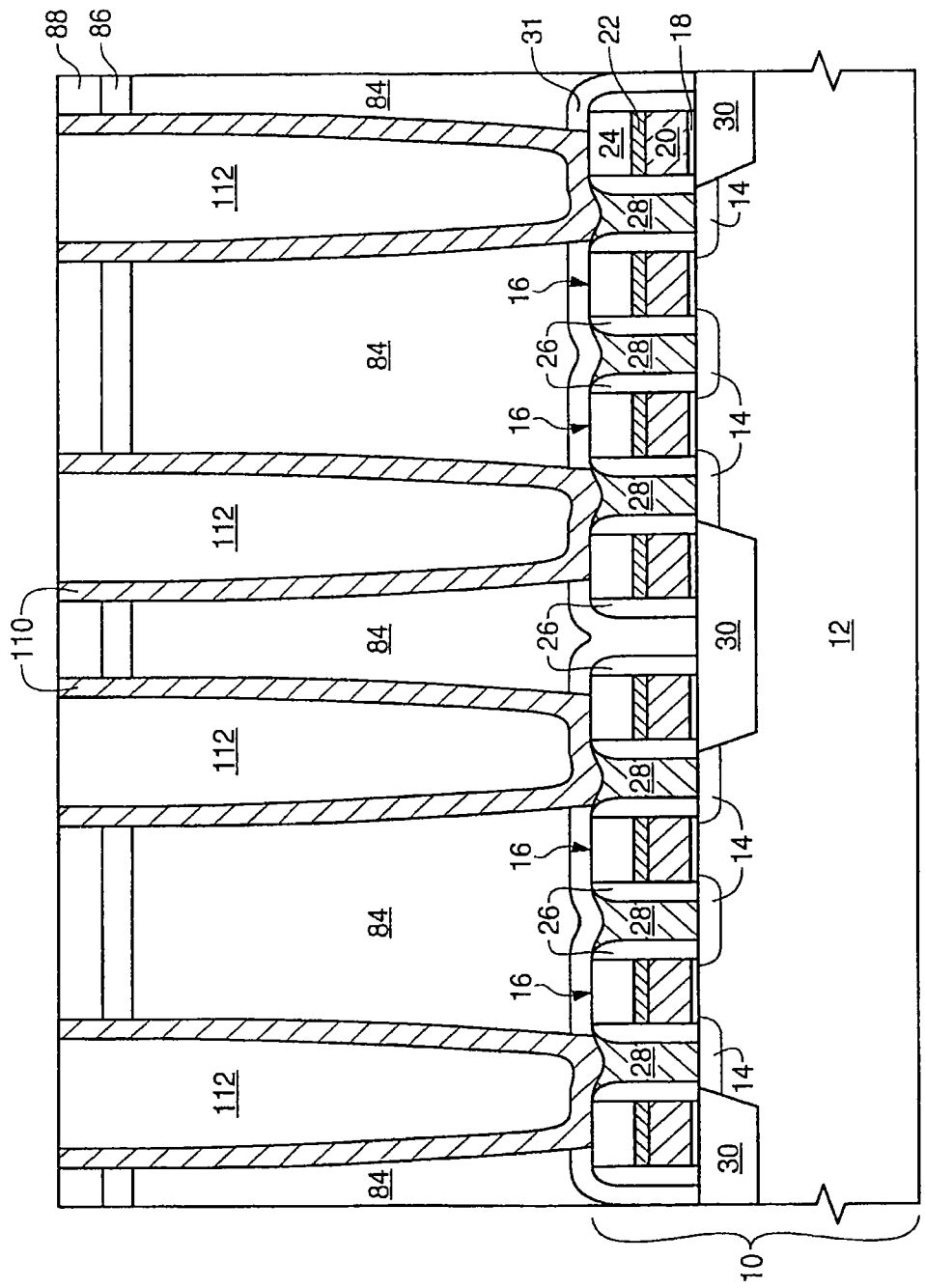

After forming the structure of FIG. 12, sacrificial layer 88 is selectively etched to expose the underlying support layer 86, then protective layer 112 is removed. For example, a sacrificial layer 88 of silicon dioxide can be etched selective to a silicon nitride support layer 86 and a titanium nitride bottom plate layer 110 using a wet etch comprising hydrofluoric acid (HF). Likewise, a protective layer 112 of photoresist can be removed by ashing the material at a temperature of between about 150° C. and about 300° C., and then subjecting the ash to a wet etch, for example using hydrofluoric acid (HF) to remove the photoresist ash. The etch of the sacrificial layer 88 can be performed either before or after removal of protective layer 112, if the etch is selective to the material of bottom plate 110. If the etch of layer 88 is performed after removal of layer 112, the etchant may traverse any pinholes or other voids within bottom plate layer 110 and begin to etch oxide layer 84. This is not detrimental, however, as layer 84 will be removed during subsequent processing and provides no further critical function. The removal of protective layer 112 and sacrificial layer 88 results in the FIG. 13 structure.

Figure 13:
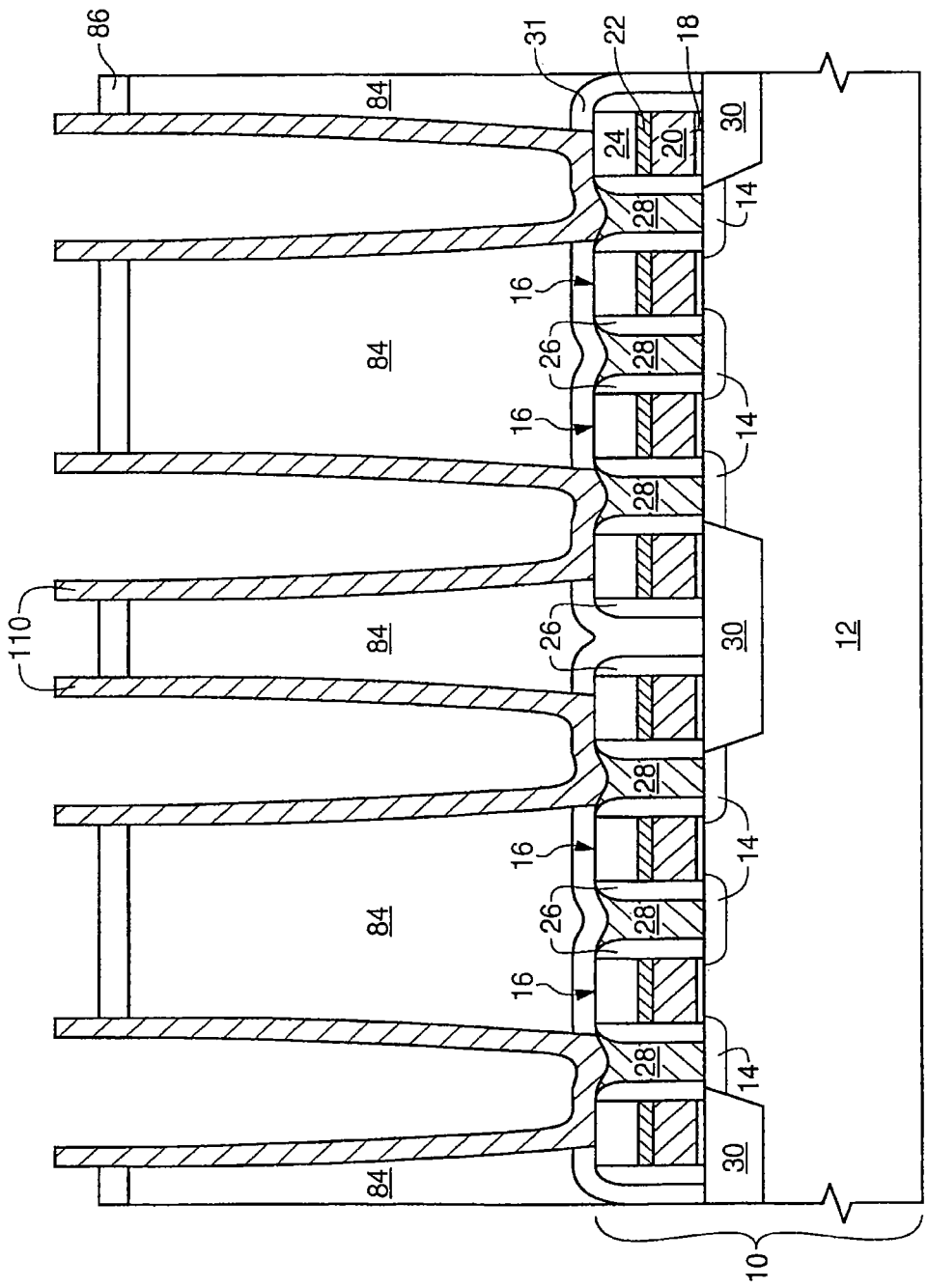
Figure 14:
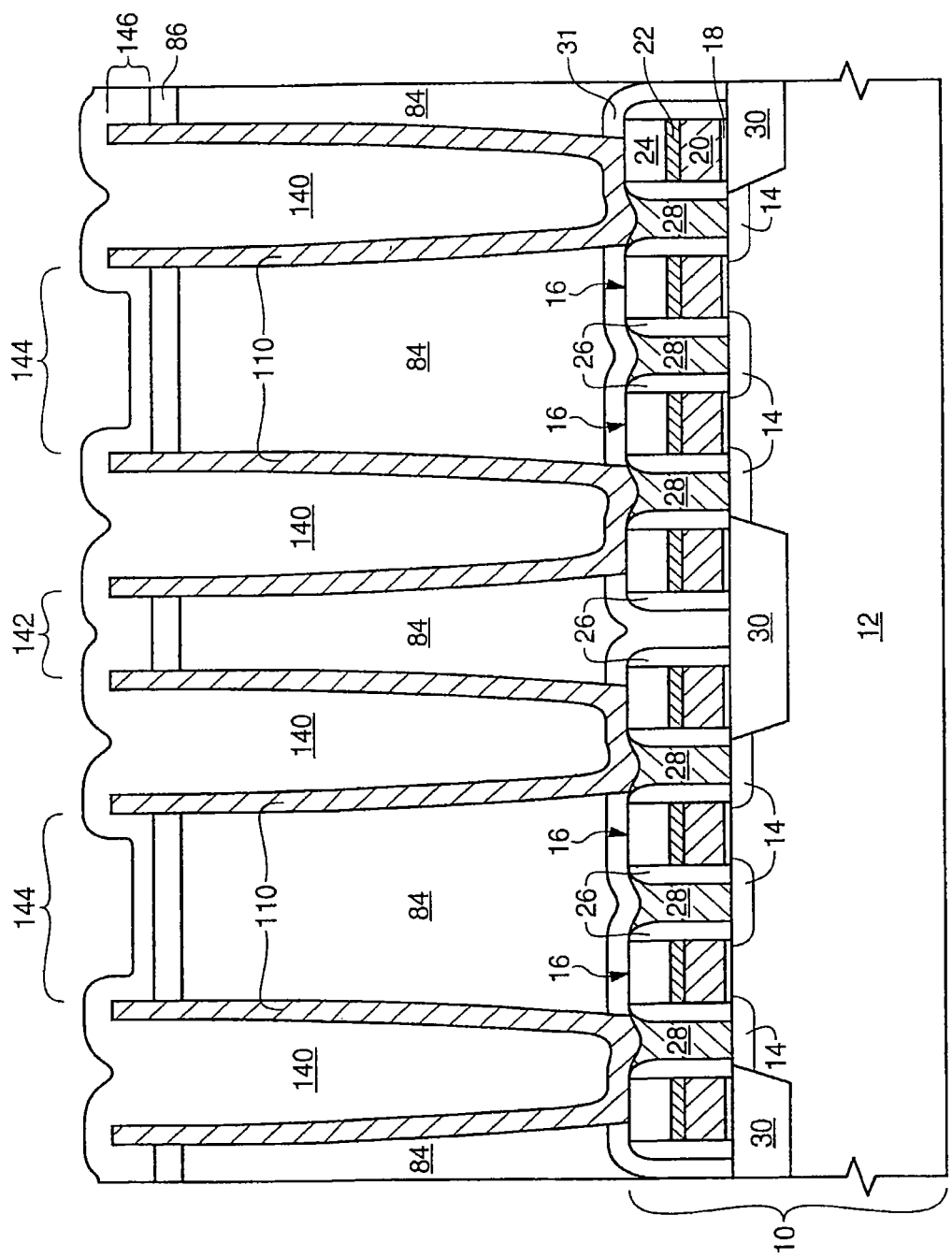

Next, a masking spacer layer 140 is formed over the surface of the FIG. 13 structure to result in the structure of FIG. 14. The material selected for this layer must be able to withstand an etch of support layer 86, and must also be etchable selective to the material of support layer 86 and bottom plates 110. With a nitride support layer and titanium nitride bottom plates, polysilicon would function sufficiently. The masking spacer layer is formed to a thickness sufficient to fill in and impinge on itself in narrow regions 142, and form conformally in the wider regions 144. With current technology, the narrow regions 142 may have a width of between about 200 Å and about 600 Å, the wider regions 144 may have a width of between about 600 Å and about 1,200 Å. The height of the exposed portions 146 of capacitor bottom plates 110, which is determined by the thickness of sacrificial layer 88, is between about 300 Å and about 600 Å. To result in the structure of FIG. 14, a conformal polysilicon layer 140 is formed to have a target thickness of between about 200 Å and about 500 Å when measured over wide, flat surfaces. FIG. 14 depicts layer 140 completely filling the recess in the bottom plates, but this may not occur, depending on the size of the opening within the bottom plate. However, enough material will likely form to prevent any damage to the bottom of plates 110 during a subsequent spacer etch of layer 140 described below.

Figure 15:
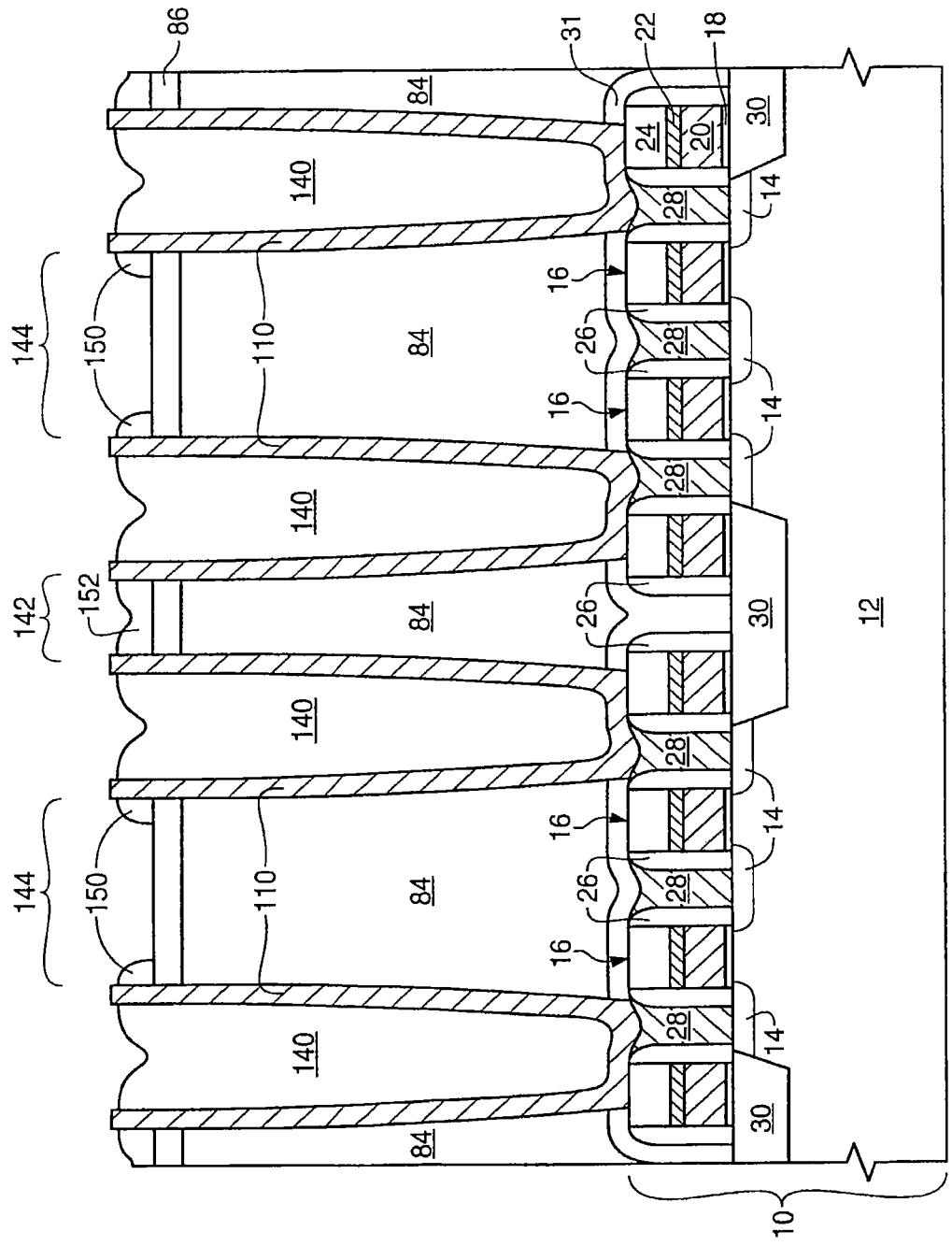

Next, an anisotropic spacer etch is performed on the masking spacer layer 140 to result in the FIG. 15 structure. This etch removes the material of the masking spacer layer 140 selective to the material of support layer 86 and bottom plates 110. After etching layer 140, spacers 150 remain in the wider regions 144, while layer 152 remains to bridge the narrow regions 142 formed by adjacent bottom plates 110.

Figure 16:
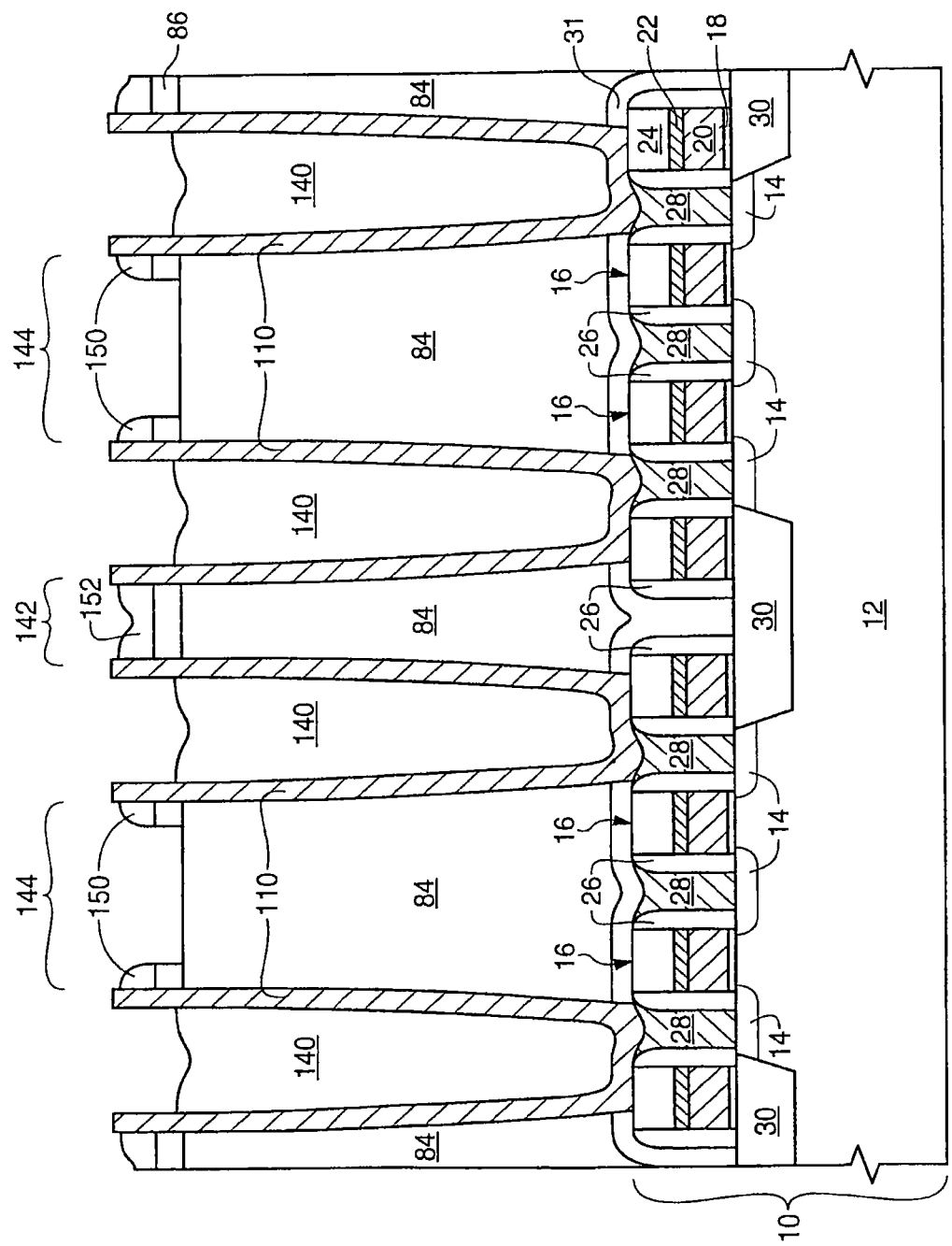

After forming spacers 150, the support layer 86 is etched using the spacers 150 and the other remaining portions 152 of layer 140 as a mask to result in the FIG. 16 structure. FIG. 16 is depicted in plan view along 1-1 of FIG. 17, which depicts part of an array of container capacitor bottom plates 110 and the remaining portions 150, 152 of the masking spacer layer 140. Various capacitor layouts other than the one depicted in FIG. 17 can be used with the present invention. As this pattern of the masking layer defines the support layer 86, the configuration of the support layer 86 is analogous to that of the masking spacer layer of FIG. 17. The etch of the support layer 86 with this mask removes the material of support layer 86 selective to the material of bottom plates 110. The spacers 150 and support layer 86 can also be etched during the same operation, but it is more likely that the spacers 150 will be etched during one process and the support layer 86 will be etched during another separate etch. During the etch of support layer 86 a portion of polysilicon layer 140 and spacers 150 may also be removed, as long as enough of these two features remain to allow exposure of BPSG 84 in the wide regions 144 and protection of support layer 86 in the narrow regions 142.

Figure 18:
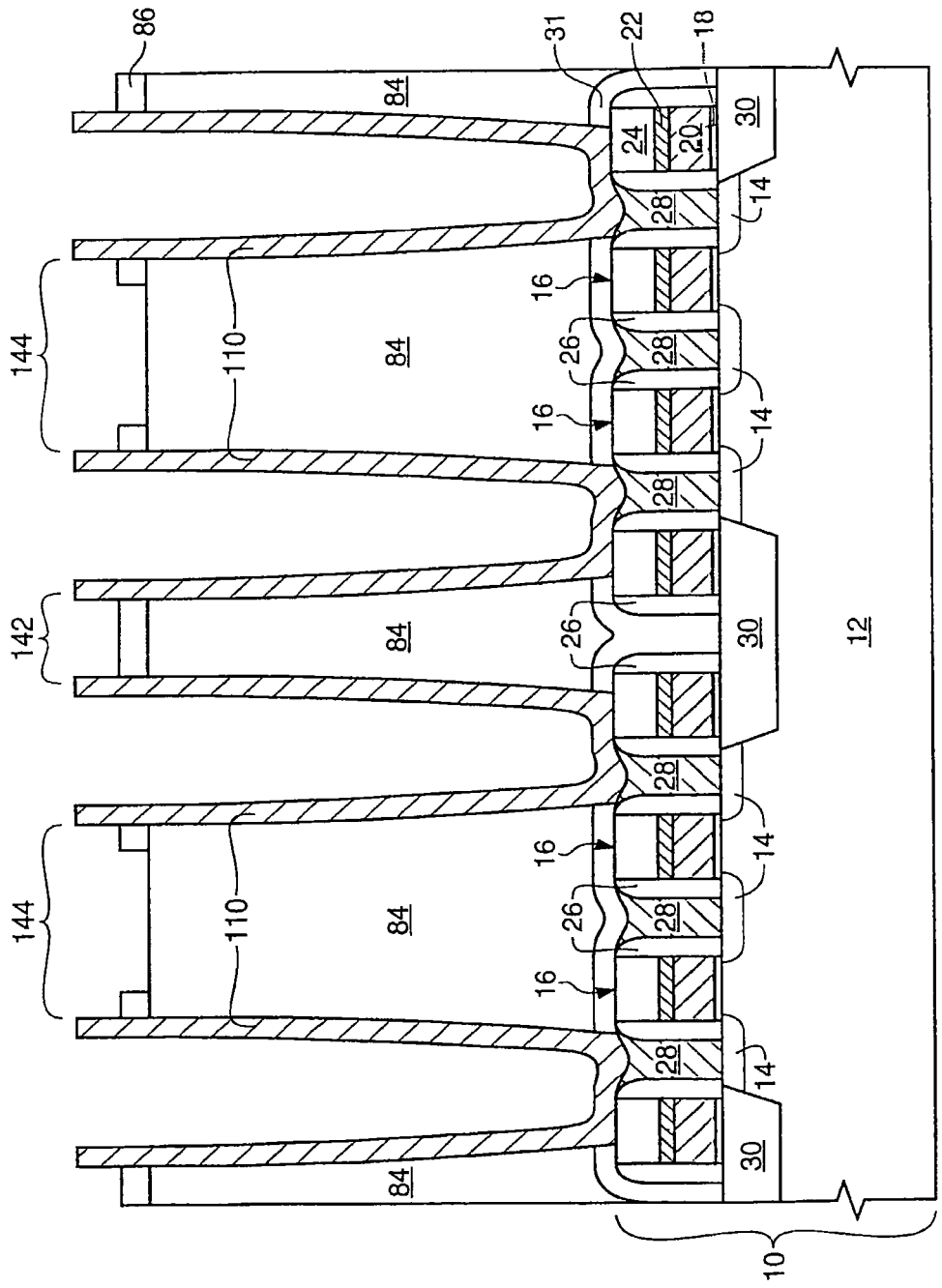

The remaining portions 140, 150, and 152 of the masking spacer layer can be removed at this point to result in the structure of FIG. 18, or they may remain in place. If polysilicon spacers are removed, they can be etched selective to silicon nitride support layer 86 and titanium nitride bottom plates 110 using a wet etch comprising tetramethyl ammonium hydroxide (TMAH).

Figure 19:
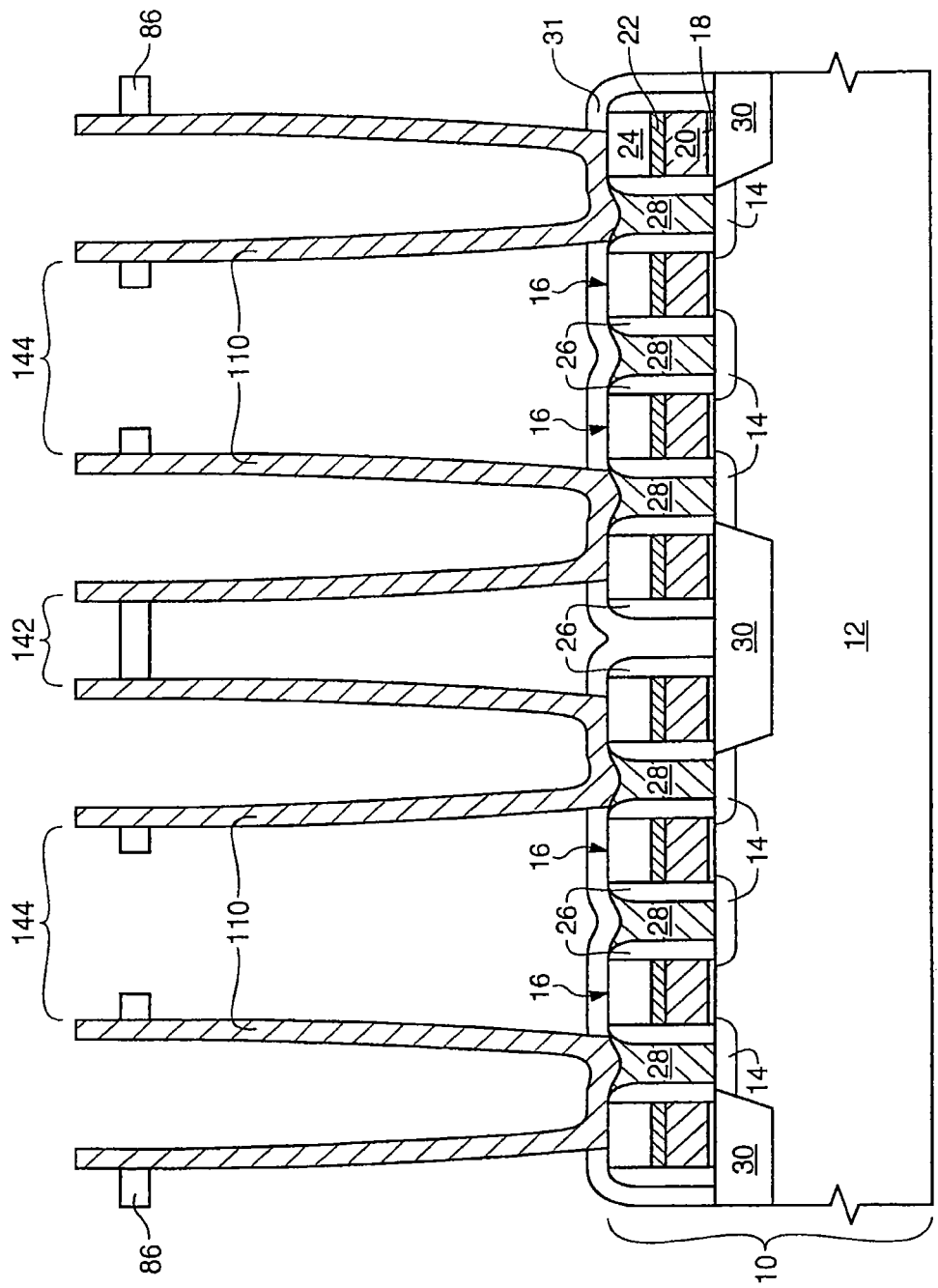

FIG. 19 depicts the structure resulting from the removal of polysilicon features 140, 150, and 152, and after etching of base dielectric layer 84. The base dielectric layer is removed selective to support layer 86, bottom plates 110, and etch stop 31. An etch which removes silicon dioxide selective to silicon nitride and titanium nitride includes a wet etch of hydrofluoric acid (HF) to result in the structure of FIG. 19. The etchant completely removes the exposed base dielectric layer 84 depicted in FIG. 17, and removes all of dielectric 84 around each capacitor bottom plate 110.

Figure 17:
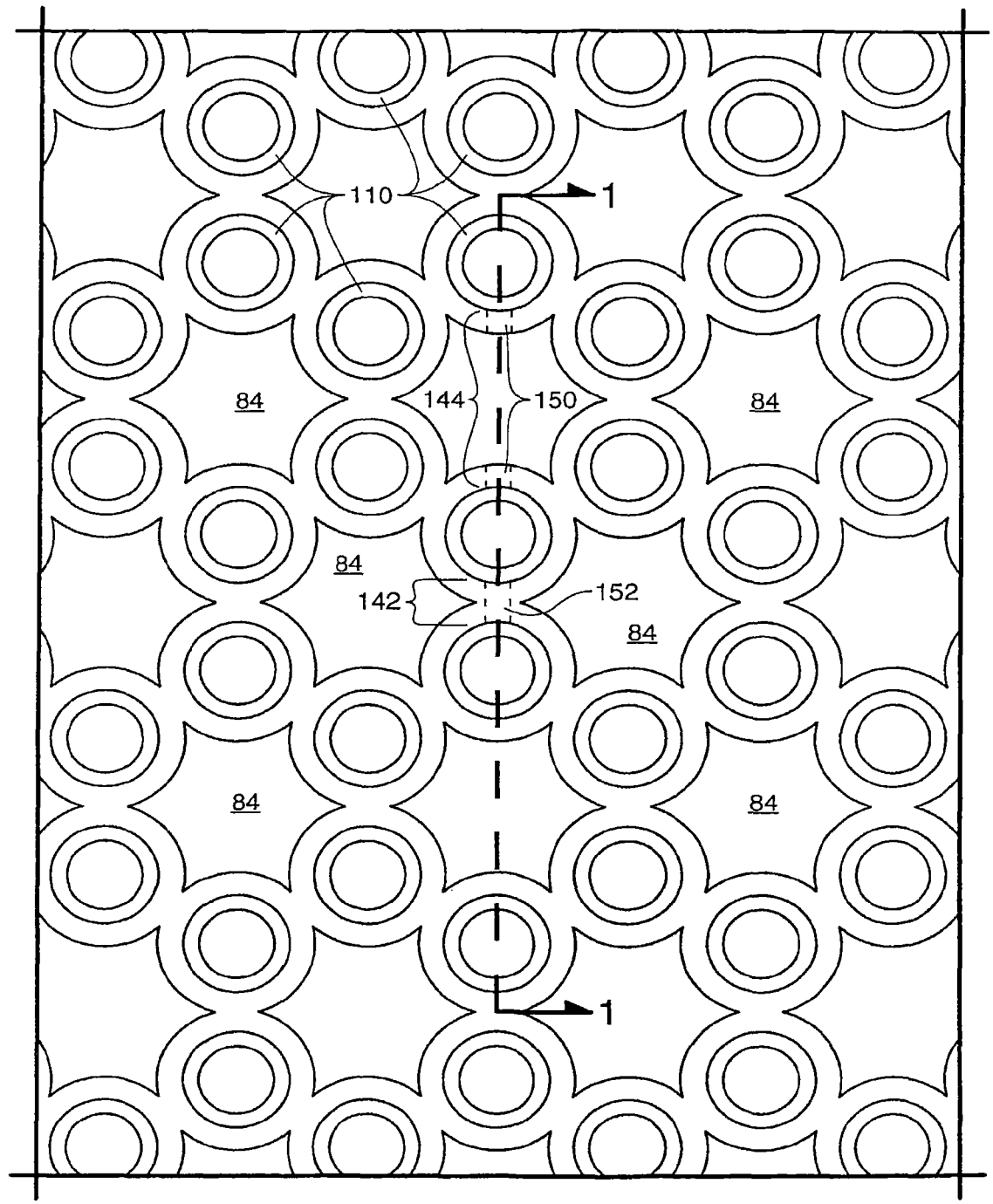
FIG. 17 is a plan view, depicting embodiments of the inventive method for forming a double-sided container capacitor structure.

As depicted in the FIG. 19 structure, support structures 86 support the capacitors after removal of the base dielectric layer 84. Removal of the base dielectric layer is necessary to allow the formation of a double-sided capacitor. These support structures provide a dielectric collar for each bottom plate, with each collar being continuous with adjacent collars such that the support layer forms a matrix which braces all capacitor bottom plates. The arrangement of the support layer can be determined from FIG. 17, which depicts the pattern of masking spacer layer 150, 152, and also of the etched support layer 86. As depicted in FIG. 19, the top and bottom surfaces of support layer 86 are free from contact with any other layer. However, some of dielectric 84 may remain, especially at the point of contact between the support layer 86 and the bottom plate 110, which may be more difficult to clear completely. In any case, even if some of this dielectric 84 remains to contact the bottom side of layer 86, the top and bottom surface of support layer 86 will remain generally free from contact with any other layer. It is conceivable that for some capacitor arrangements and processes the collar may not surround the capacitor bottom plate through 360° as depicted in FIG. 17. Further, the bottom plates or other feature being supported by the collar may not be circular as depicted in FIG. 17, but may be oval, ovoid, square, rectangular, etc. in shape.

If the remaining portions 150, 152 of spacer layer 140 have not yet been removed, they must be removed at this point to prevent shorting between capacitor bottom plates.

Figure 20:
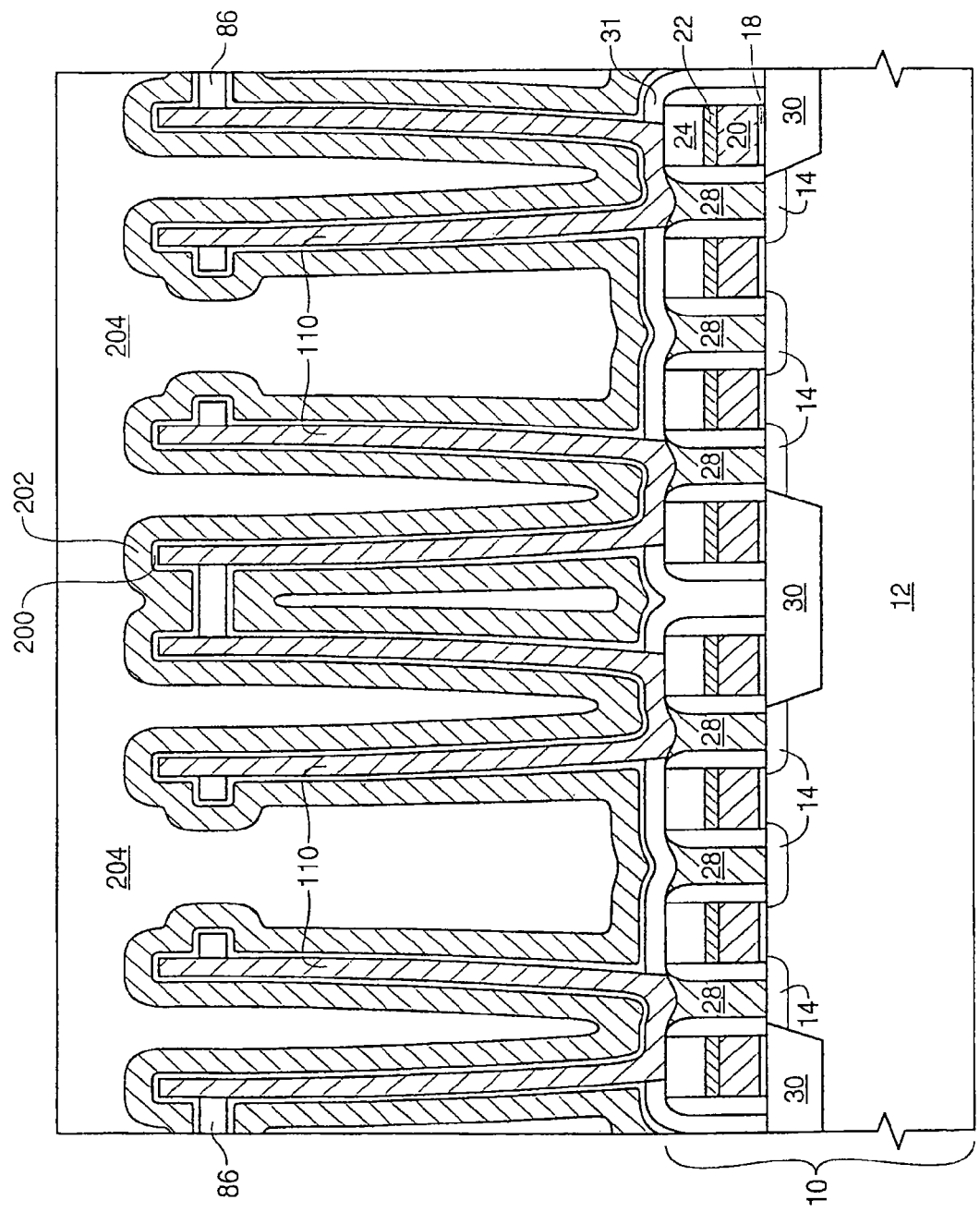

Finally, a capacitor cell dielectric 200, a capacitor top plate 202, and a dielectric layer 204 are formed according to means known in the art to form the structure of FIG. 20. Wafer processing continues according to means known in the art.

Figure 1:
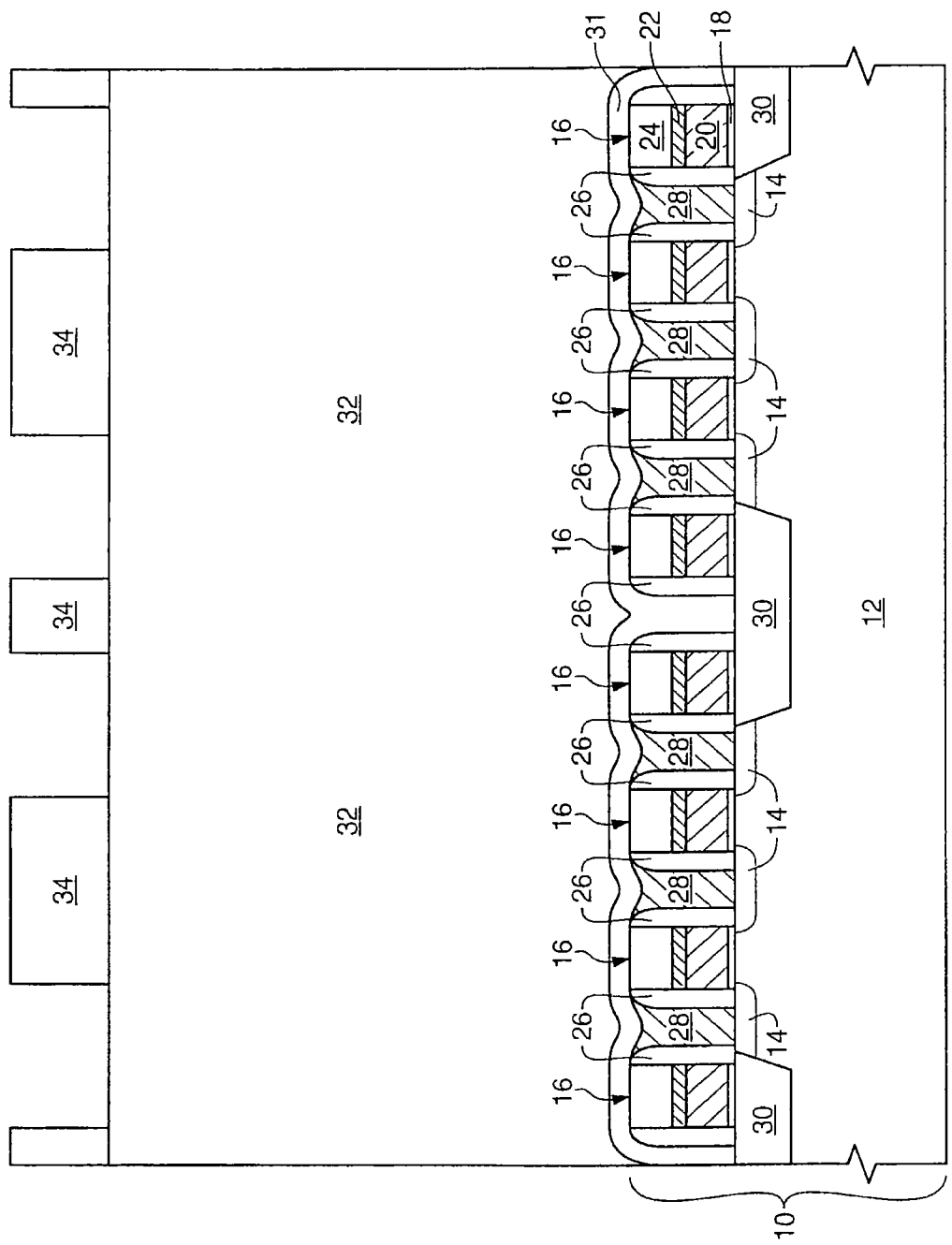
FIGS. 1-7 are cross sections depicting a conventional method for forming a double-sided container, capacitor structure.
Figure 2:
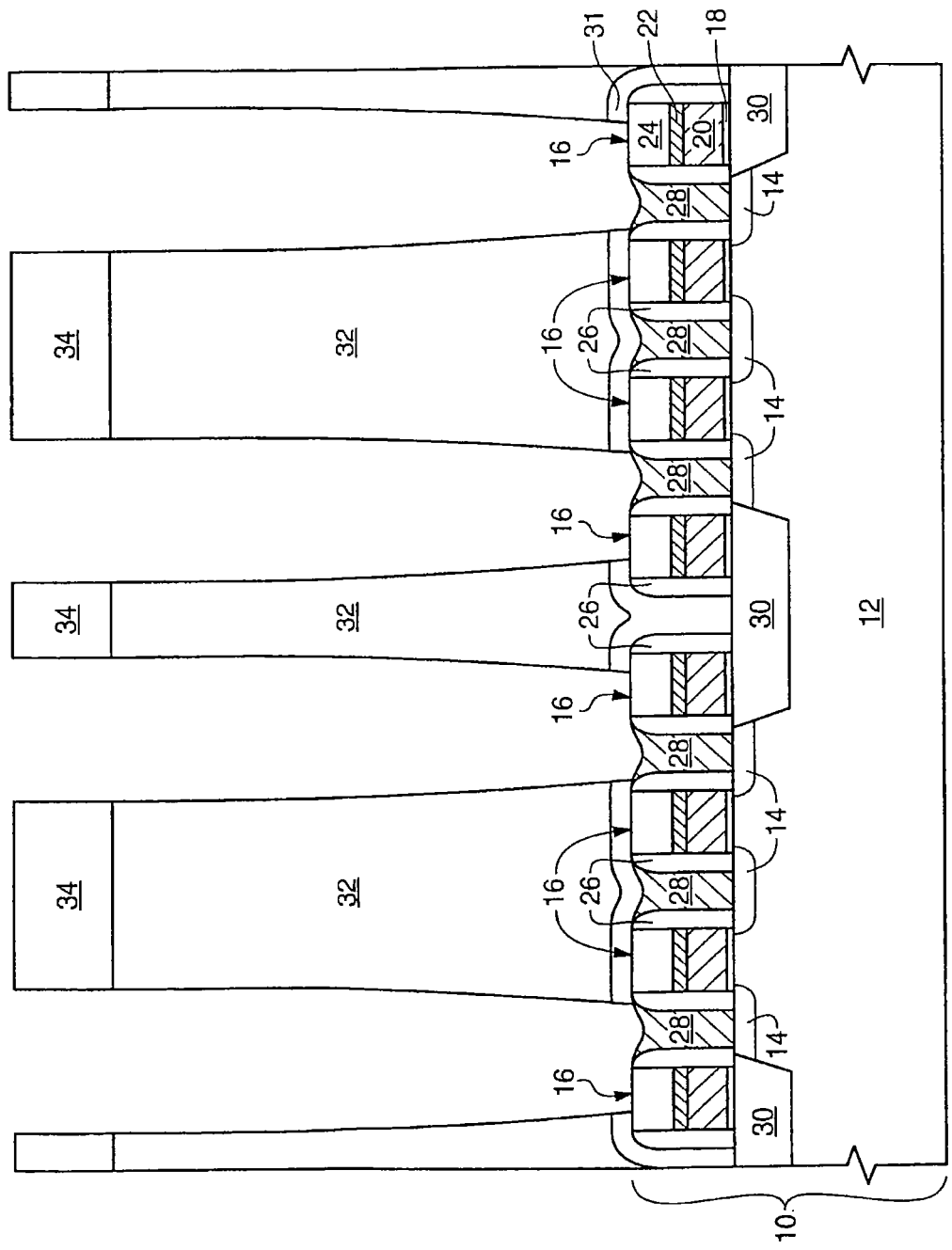
Figure 3:
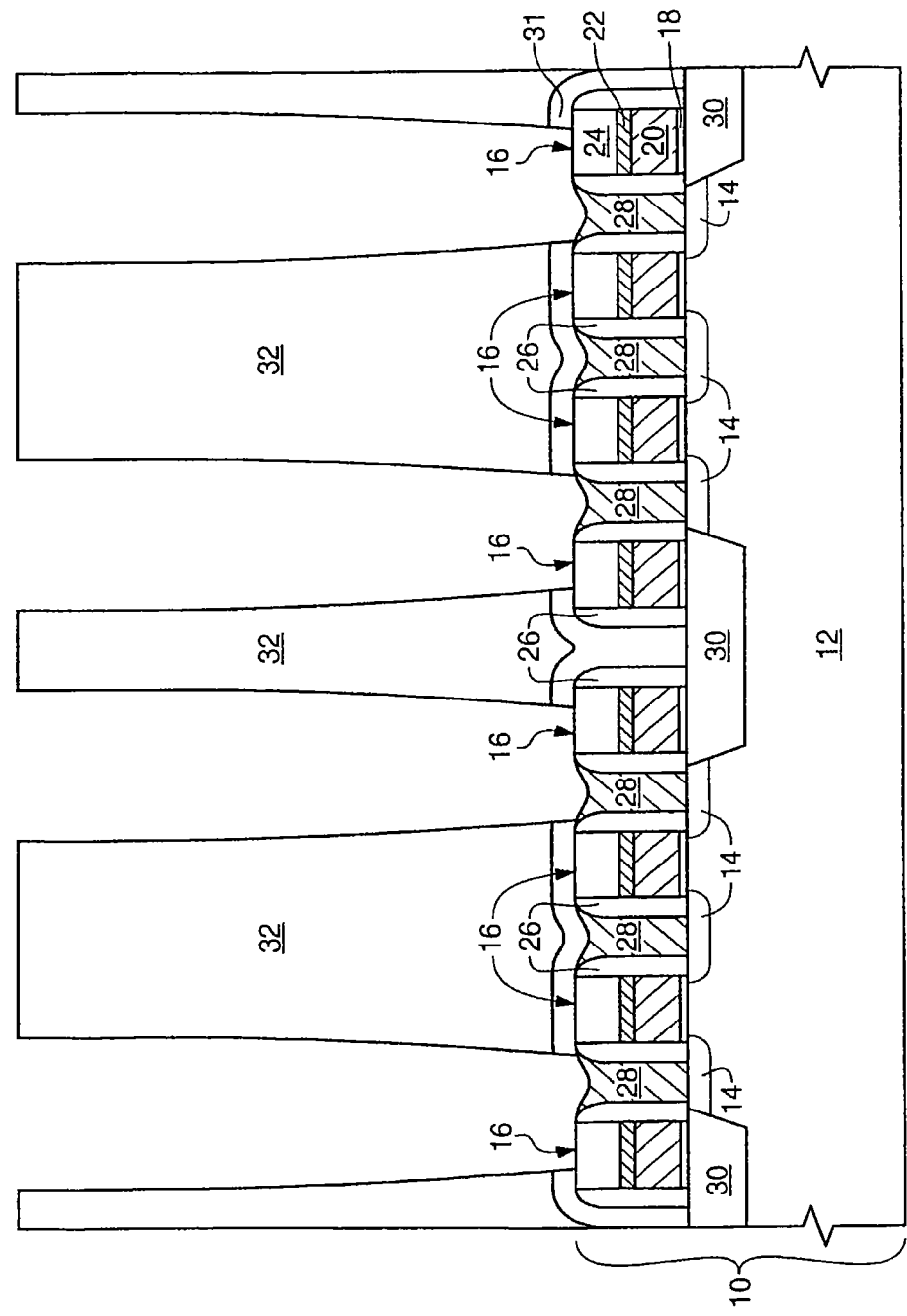
Figure 4:
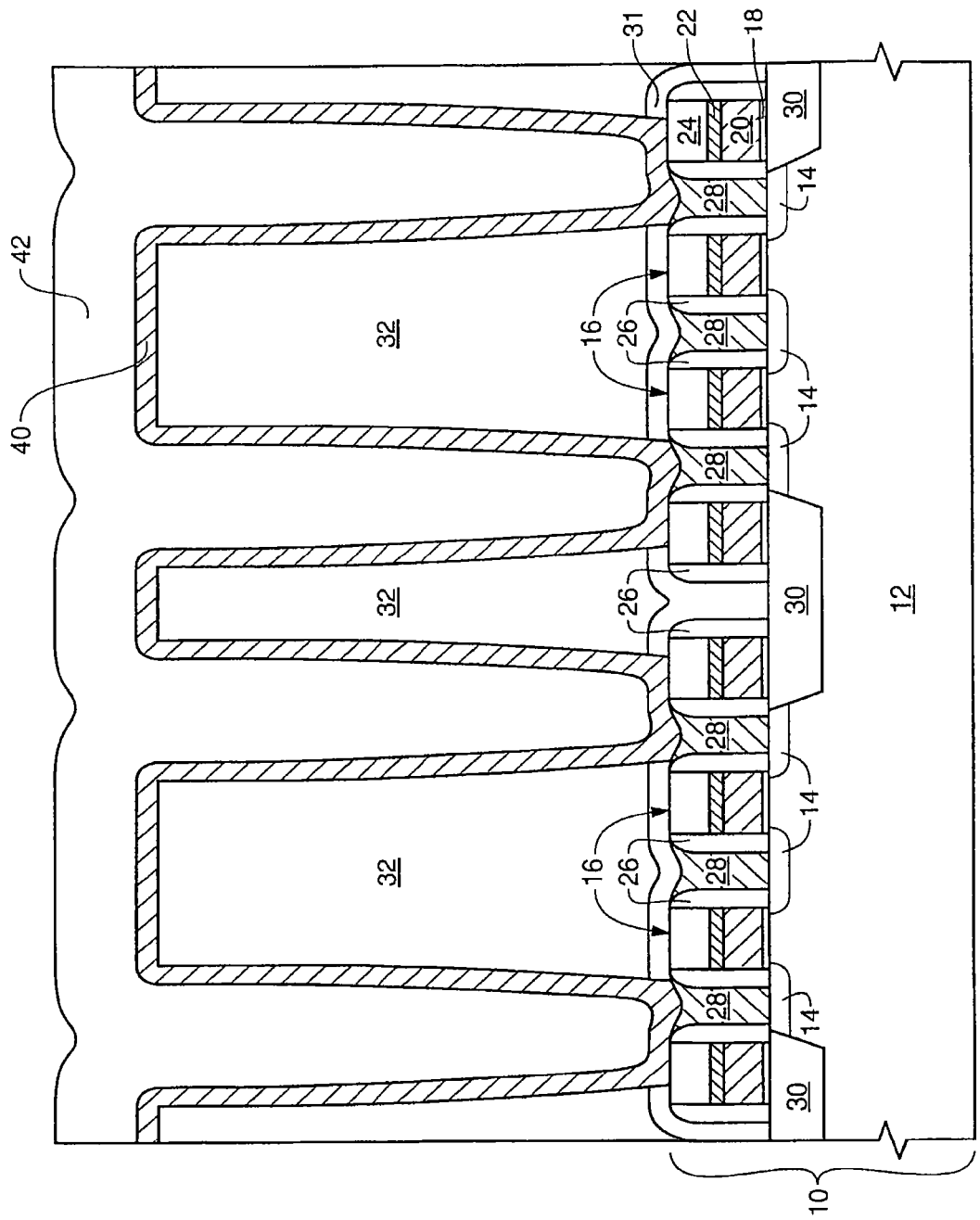
Figure 5:
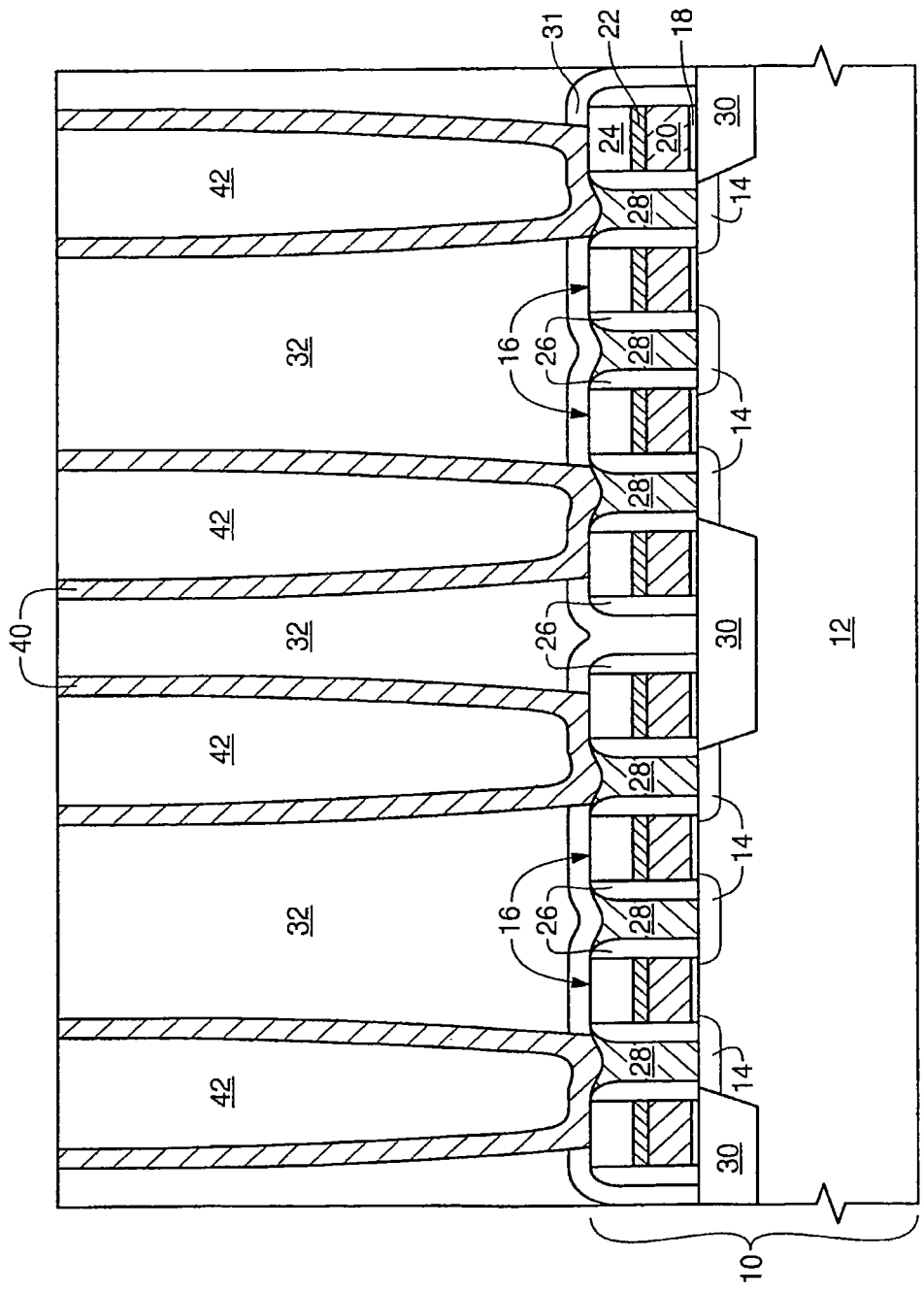
Figure 6:
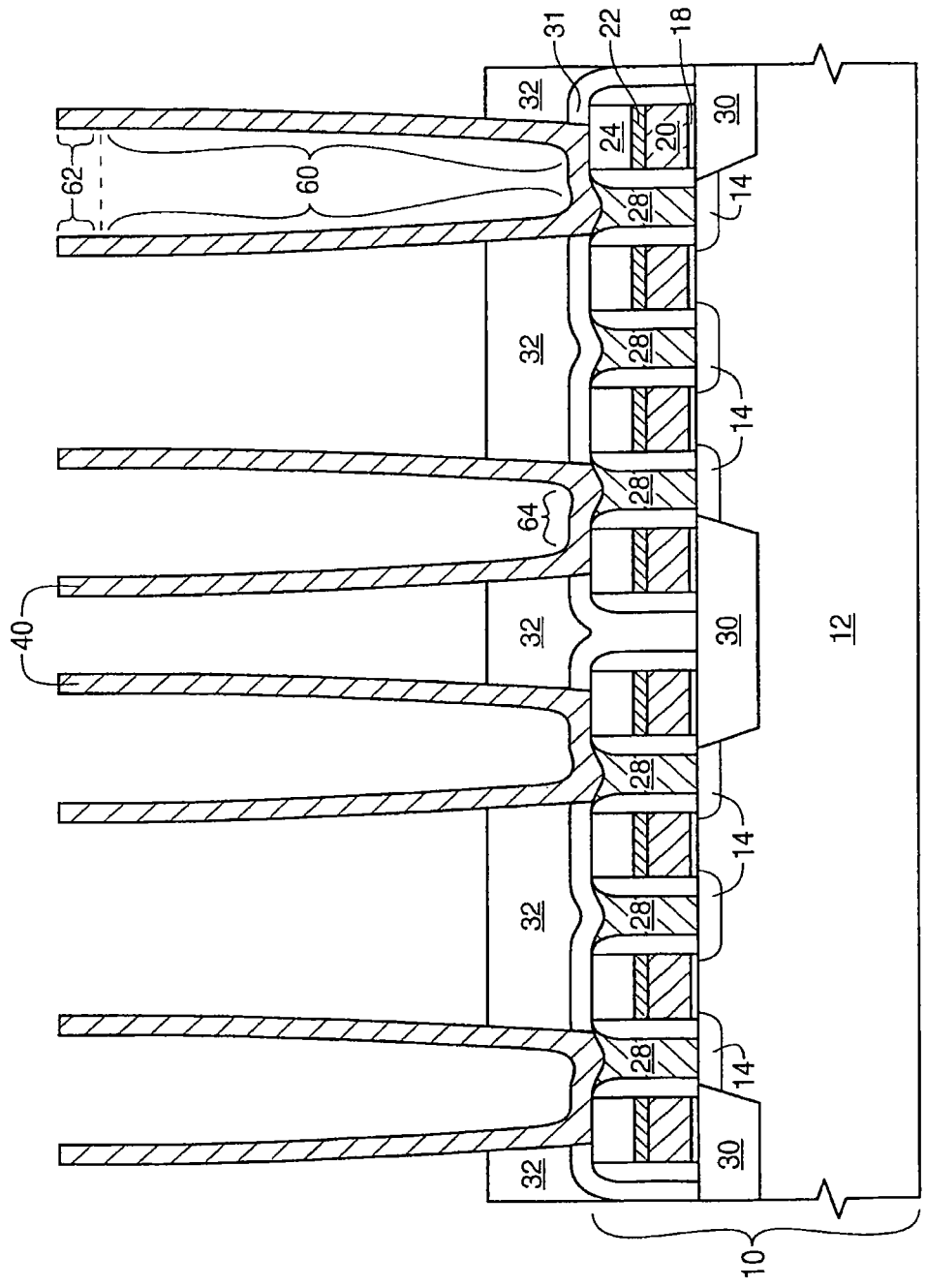
Figure 7:
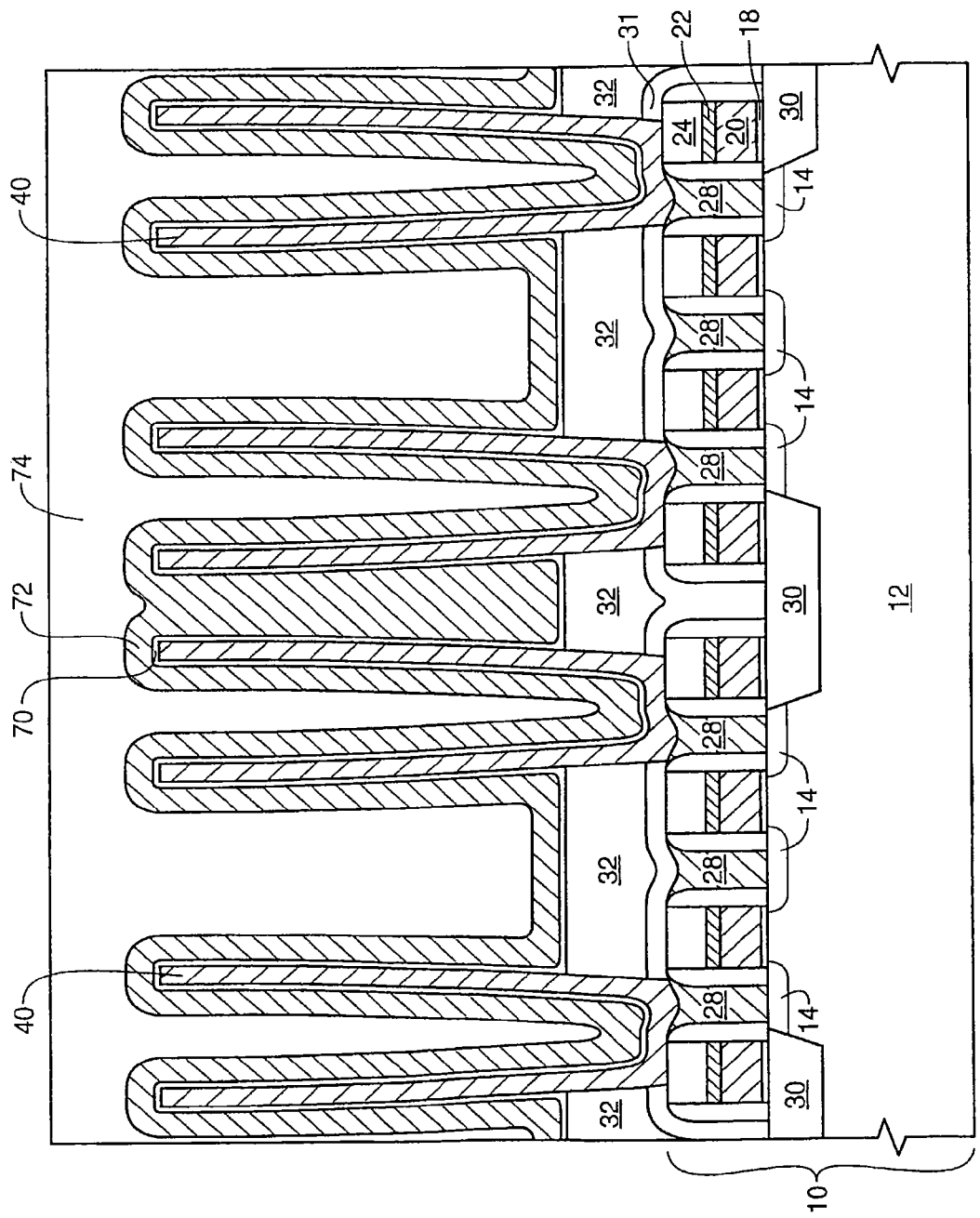

The completed structure may have improved capacitance over conventional structures, because all of the base dielectric layer can be removed which allows the top plate to be formed along more of the bottom plate than conventional structures. Referring to FIG. 6, for example, a portion of base dielectric layer 32 must remain in place to support the capacitors during formation of the cell dielectric and top plate. With an embodiment of the present invention, however, all of the base dielectric layer can be removed as depicted in FIG. 19, because support layer 86 remains to brace the bottom plates.

To prevent etching of the periphery, a mask layer may be formed prior to the etch of the sacrificial dielectric layer, prior to the etch of the masking spacer layer, or prior to the etch of the support layer. This will prevent etching of BPSG over the device periphery, which would form a step in the oxide between the periphery, where there are no storage cell capacitors, and the array, where the tops of the storage cell capacitors are at the original level of the top of layer 88. If the periphery is not protected, the periphery must be backfilled with oxide which is then planarized, after forming the cell dielectric 200 and top plate 202.

A selective etch may be performed on support layer 86 after forming spacers 152 of FIG. 16 to increase the width of the opening at 144. This larger opening may allow the base dielectric layer to be more easily removed, and may provide improved conditions for forming the cell dielectric layer 200 and capacitor top plate 202.

Figure 21:
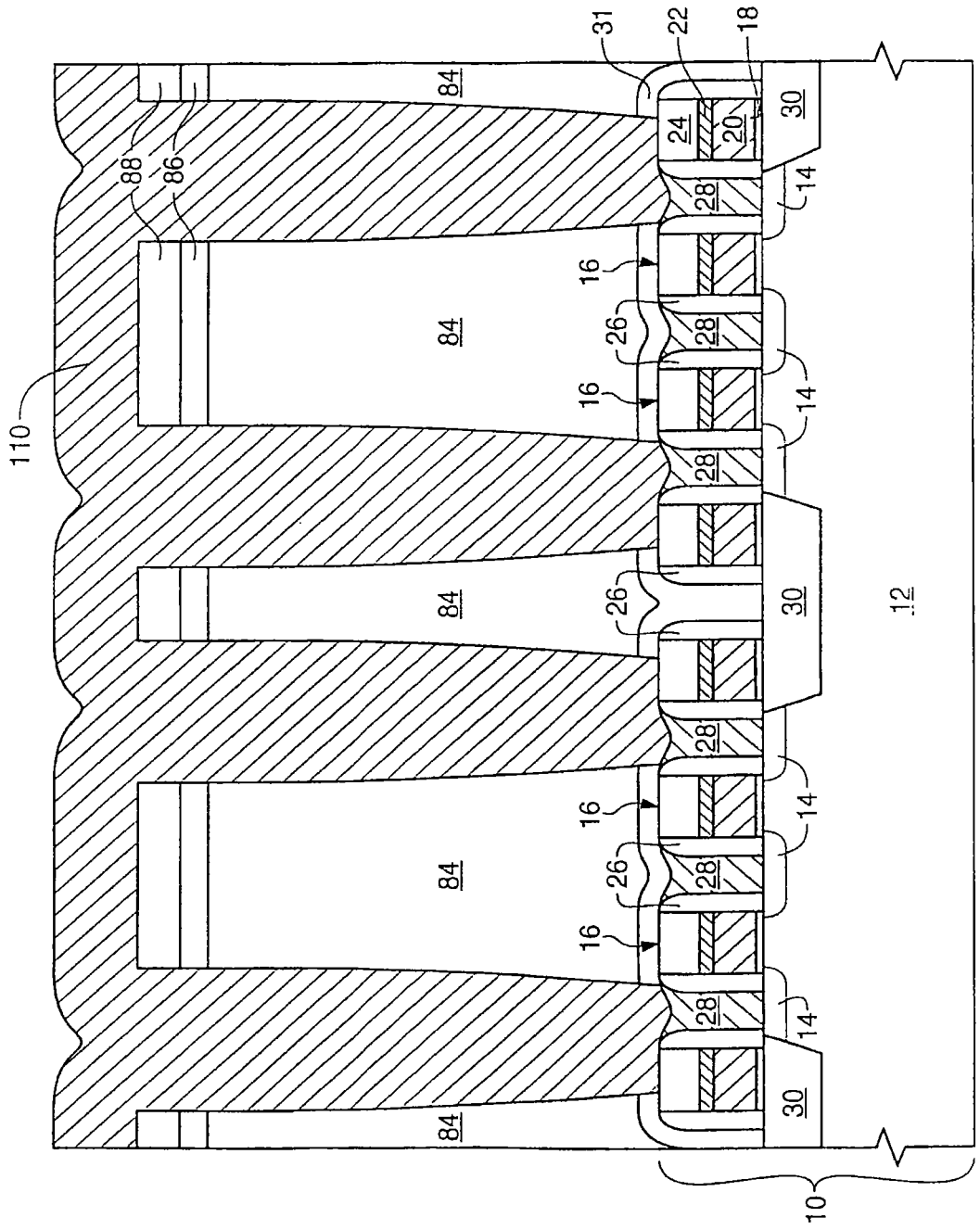
FIGS. 21 and 22 are cross sections depicting an embodiment of the invention to form a pedestal capacitor.
Figure 22:
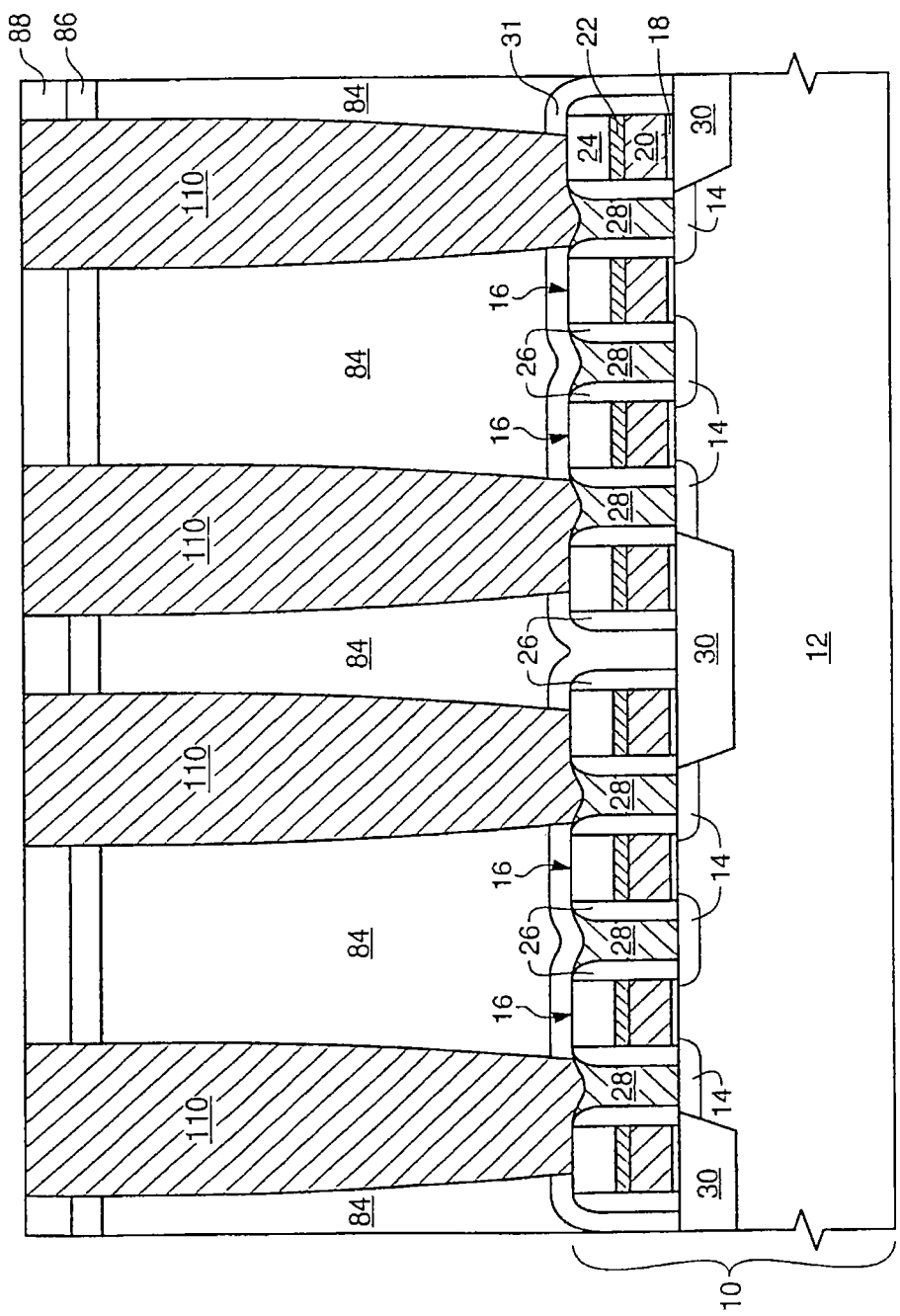

A pedestal capacitor can be formed in a manner similar to the container capacitor as depicted by FIGS. 21 and 22. As depicted in FIG. 21, the bottom plate layer 110 is formed to completely fill the recessed defined by the sacrificial layer 88, the support layer 86, and the base dielectric layer 84. Thus the bottom plate layer 110 will be much thicker than that depicted in the FIG. 11 structure. In this pedestal capacitor embodiment, protective layer 112 is not necessary, as bottom plate layer 110 completely fills the recess. After forming the FIG. 21 structure, the bottom plate layer 110 and possibly a portion of the sacrificial layer 88 is planarized to remove layer 110 from the horizontal surface of sacrificial layer 88 to leave the pedestal capacitor bottom plate 110 as depicted in FIG. 22.

In another embodiment, a single layer of material may be formed instead of forming both the sacrificial layer 88 and the support layer 86 of FIG. 12. This single layer would be a thicker layer of the material of the support layer, such as silicon nitride, and would be as thick as layers 86 and 88 combined. A timed etch would be performed on this layer to result in the structure of FIG. 13. This process is not as controllable as using two separate layers and is therefore not as preferable for most process flows, but may have advantages for some processes. Processing then continues according to the other embodiments, for example to form the masking spacer layer 140 and other subsequent steps.

Figure 23:
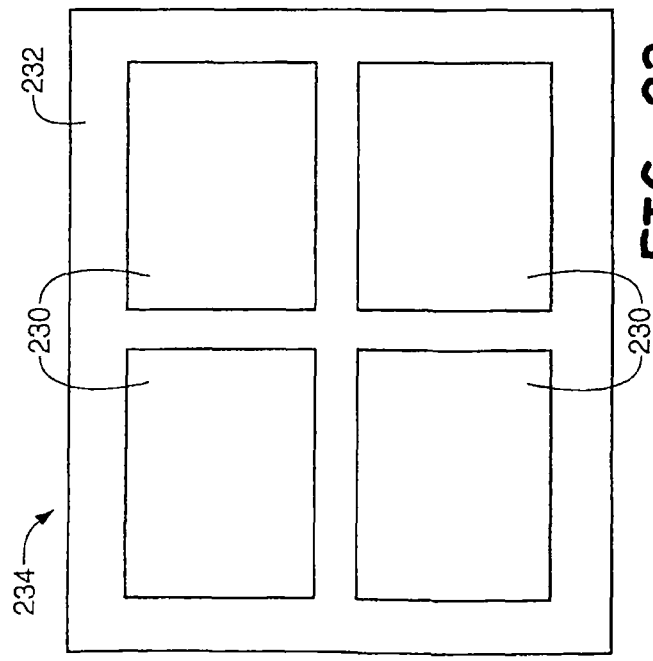
FIG. 23 is a block diagram of an exemplary use of the invention as a memory array in a dynamic random access memory.

With the above embodiments of the invention it may be necessary to protect the peripheral area of the die during processing of the array of capacitors, especially during the etch of the base dielectric of the FIG. 18 structure to form the FIG. 19 structure. FIG. 23 is a plan view depicting four arrays 230 and a periphery 232 of a semiconductor die 234 prior to forming the patterned resist layer 90 of FIG. 8. A typical memory die will likely comprise a larger number of arrays.

Figure 24:
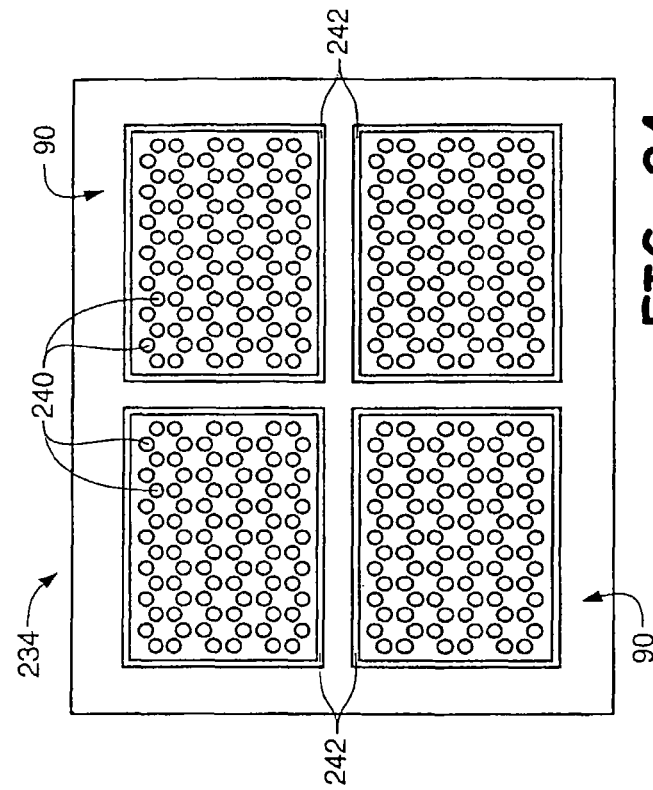
FIG. 24 is an isometric depiction of a use of the invention in an electronic device.

FIG. 24 depicts the FIG. 23 structure after forming patterned photoresist layer 90. Resist layer 90 has openings therein 240 which will allow the etch of the sacrificial layer 88, the support layer 86, and the base dielectric layer 84 of the FIG. 8 structure to form the FIG. 9 structure. FIG. 24 is not to scale, and many more openings 240 for capacitors will be formed than are depicted. Resist layer 90 also has openings therein 242 which form a "moat" around the array which will protect the periphery 232 during the removal of base dielectric layer 84 to form the FIG. 19 structure. This moat will be filled with material during the formation of the capacitor bottom plate 110, and thus no additional processing is required to form and fill the moat. For current processing, the moat may be between about 200 Å and about 600 Å wide. During the etch of the base dielectric through the collar, a photoresist layer would be formed to cover and protect the periphery but to expose the array. The photoresist layer and the layer within the moat thereby protects the dielectric layer such as BPSG in the periphery from being etched during the removal of the base dielectric layer which exposes the sidewalls of the capacitor bottom plates.

Figure 25:
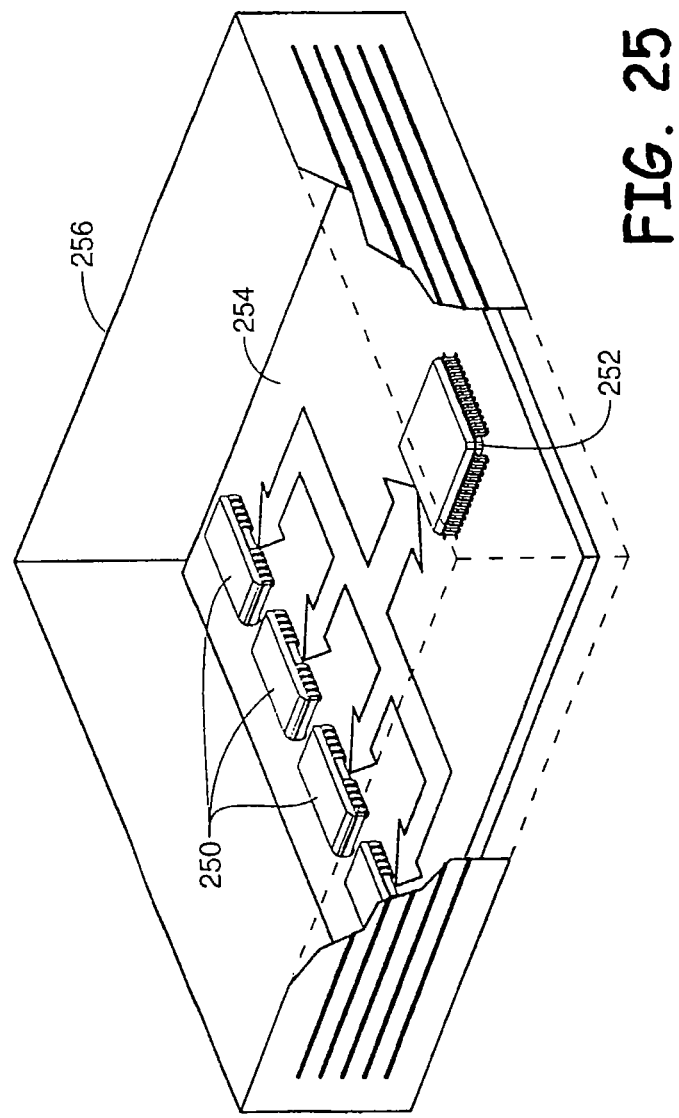
FIG. 25 is a perspective view of electronic device that includes a semiconductor device formed according to the present invention.

As depicted in FIG. 25, a semiconductor device 250 formed in accordance with the invention may be attached along with other devices such as a microprocessor 252 to a printed circuit board 254, for example to a computer motherboard or as a part of a memory module used in a personal computer, a minicomputer, or a mainframe 256. FIG. 25 may also represent use of device 250 in other electronic devices comprising a housing 236, for example devices comprising a microprocessor 252, related to telecommunications, the automobile industry, semiconductor test and manufacturing equipment, consumer electronics, or virtually any piece of consumer or industrial electronic equipment.

Figure 26:
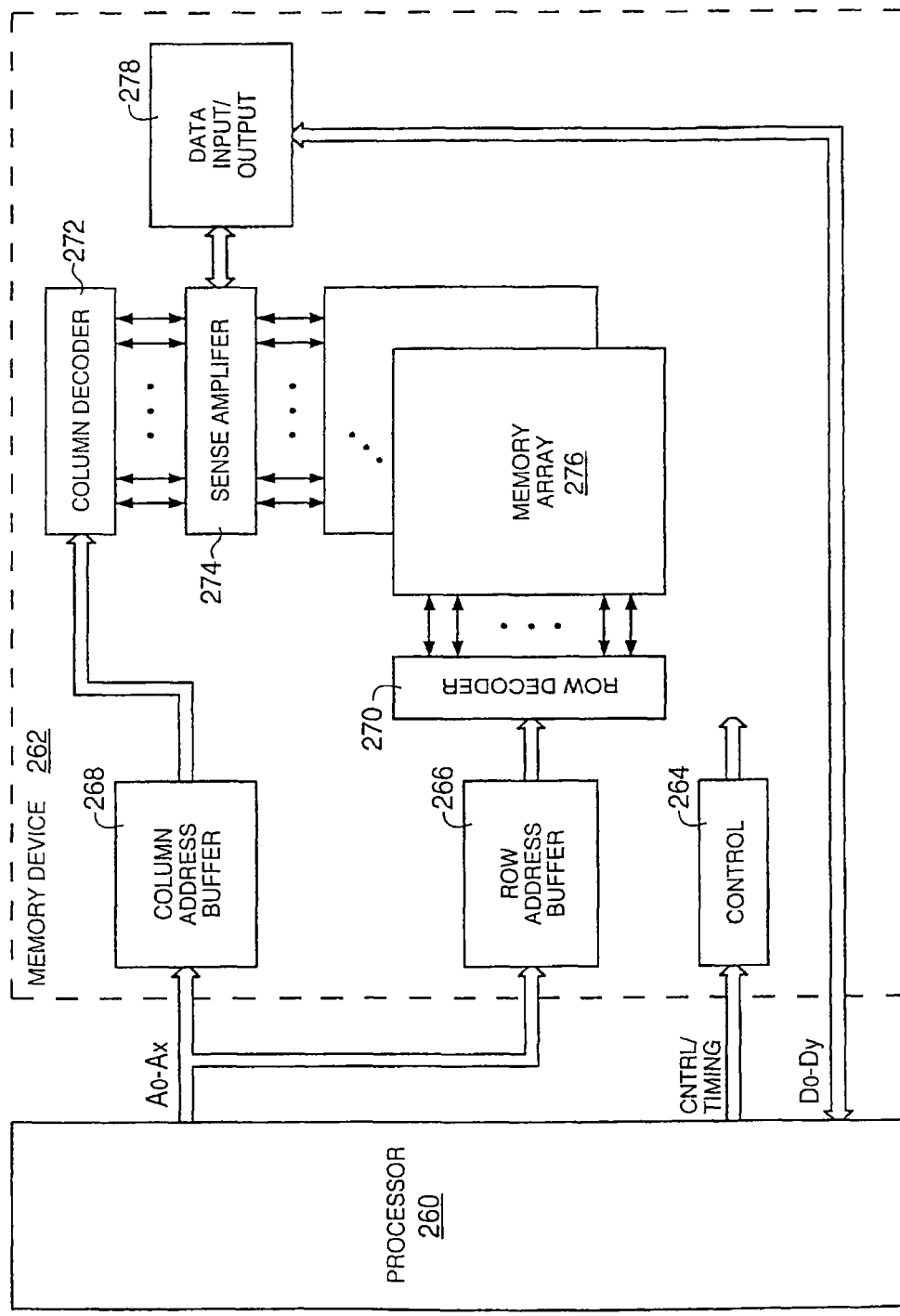
FIG. 26 is a block diagram of a memory device coupled to a processor.

The process and structure described herein can be used to manufacture a number of different structures which comprise a capacitor such as a container capacitor or a pedestal capacitor. FIG. 26, for example, is a simplified block diagram of a memory device such as a dynamic random access memory having a memory array with container capacitors which may be formed using an embodiment of the present invention. The general operation of such a device is known to one skilled in the art. FIG. 26 depicts a processor 260 coupled to a memory device 262, and further depicts the following basic sections of a memory integrated circuit: control circuitry 264; row 266 and column 268 address buffers; row 270 and column 272 decoders; sense amplifiers 274; memory array 276; and data input/output 278.

While this invention has been described with reference to illustrative embodiments, this description is not meant to be construed in a limiting sense. Various modifications of the illustrative embodiments, as well as additional embodiments of the invention, will be apparent to persons skilled in the art upon reference to this description. It is therefore contemplated that the appended claims will cover any such modifications or embodiments as fall within the true scope of the invention.

What is claimed is:

1. An in-process semiconductor device comprising: a plurality of container capacitor bottom plates with each plate comprising a bottom and first and second cross-sections, vertically-oriented sides each having a height with each side being unsupported along a majority of its height; a supporting layer having a bottom surface and a top surface, wherein the supporting layer contacts the exterior of each container capacitor bottom plate of the plurality of bottom plates and completely surrounds the cross sections of the bottom plates, and wherein the top and bottom surfaces of the supporting layer are generally free from contact with any other layer; an array area comprising the plurality of container capacitors, bottom plates and a periphery area; and a moat between the periphery area and the array area and having a first side which faces the periphery area and a second side which faces the array area, wherein the second side is exposed and the first side is not exposed.

2. The in-process semiconductor device of claim 1, wherein the supporting layer has a material selected from the group consisting of silicon dioxide, borophosphosilicate glass, and tetraethyl orthosilicate.

3. The in-process semiconductor device of claim 1 wherein the plurality of container capacitor bottom plates comprises first, second, and third container capacitor bottom plates and the in-process semiconductor device further comprises:
    the first and second capacitor bottom plates, in one of the cross sections, being spaced by a first distance;
    the second and third capacitor bottom plates, in one of the cross sections, being spaced by a second distance which is less than the first distance; and
    the supporting layer, in one of the cross sections, bridging between the second and third capacitor bottom plates and not bridging between the first and second capacitor bottom plates.

4. A semiconductor device comprising:
    an upwardly extending container-shaped bottom electrode, wherein the bottom electrode has one continuous interior surface, an exterior surface, a top region and a bottom region;
    a lateral support structure horizontally extending from a top region of the exterior surface of the bottom electrode without contacting any portion of the one continuous interior surface of the bottom electrode, the lateral support structure being in physical contact with the exterior surface of the bottom electrode along the entire perimeter of the cross section of the bottom electrode;
    a dielectric layer juxtaposed with both a substantial area of the interior surface and a substantial area of the exterior surface; and
    a top electrode over at least a portion of the dielectric layer to allow capacitive coupling between the top electrode and a substantial area of both the interior and exterior surfaces of the bottom electrode.

5. The semiconductor device of claim 4 wherein the lateral support structure comprises silicon nitride.

6. The semiconductor device of claim 4 wherein the lateral support structure comprises an annular ring around the bottom electrode.

7. The semiconductor device of claim 6 wherein the bottom electrode is a first bottom electrode and the semiconductor device further comprises the annular ring lateral support structure being physically coupled to a second upwardly extending container-shaped bottom electrode laterally spaced from the first bottom electrode.

8. A pair of capacitor memory cells comprising:
    first and second upwardly extending vertically-oriented bottom electrodes, wherein the bottom electrodes each have an exterior surface, one continuous inner surface, a top region, and a bottom region, the first and second bottom electrodes are laterally spaced apart;
    a lateral support structure horizontally extending from a top region of the exterior surface of the first bottom electrode to a top region of the exterior surface of the second bottom electrode and extending along the entire perimeters of the horizontal cross-sections of the first and second bottom electrodes the lateral support structure not in contact with any interior portion of the bottom electrode;
    a dielectric layer covering a majority of the exterior surfaces of the first and second bottom electrodes; and
    a common top electrode over at least a portion of the dielectric layer to allow capacitive coupling between the top electrode and a majority of both the exterior surfaces of the first and second bottom electrodes.

9. The pair of capacitor memory cells of claim 8 wherein:
    the first and second bottom electrodes each define a container having an interior surface;
    the dielectric layer covers a majority of the interior surfaces of the first and second bottom electrodes; and
    the common top electrode over at least a portion of the dielectric layer allows capacitive coupling between the common top electrode and a majority of both the interior surfaces of the first and second bottom electrodes.

* * * * *